US009502391B2

(12) United States Patent
Kwon et al.

(10) Patent No.: US 9,502,391 B2
(45) Date of Patent: Nov. 22, 2016

(54) SEMICONDUCTOR PACKAGE, FABRICATION METHOD THEREFOR, AND PACKAGE-ON PACKAGE

(71) Applicant: NEPES CO., LTD., Eumseong-gun, Chungcheongbuk-do (KR)

(72) Inventors: Yong-Tae Kwon, Suwon-si (KR); Kyung-Hoon Park, Seoul (KR)

(73) Assignee: NEPES CO., LTD. (KR)

( * ) Notice: Subject to any disclaimer, the term of this patent is extended or adjusted under 35 U.S.C. 154(b) by 0 days.

(21) Appl. No.: 14/404,005

(22) PCT Filed: May 9, 2013

(86) PCT No.: PCT/KR2013/004073
§ 371 (c)(1),
(2) Date: Nov. 25, 2014

(87) PCT Pub. No.: WO2013/176426
PCT Pub. Date: Nov. 28, 2013

(65) Prior Publication Data
US 2015/0187742 A1    Jul. 2, 2015

(30) Foreign Application Priority Data

May 25, 2012  (KR) .................. 10-2012-0056340
May 25, 2012  (KR) .................. 10-2012-0056341

(51) Int. Cl.
*H01L 23/02*       (2006.01)
*H01L 25/10*       (2006.01)
(Continued)

(52) U.S. Cl.
CPC ............. *H01L 25/105* (2013.01); *H01L 21/56* (2013.01); *H01L 21/568* (2013.01);
(Continued)

(58) Field of Classification Search
CPC ............... H01L 25/105; H01L 23/3107; H01L 23/49827; H01L 25/0655; H01L
(Continued)

(56) References Cited

U.S. PATENT DOCUMENTS 7,545,047 B2 *   6/2009  Bauer ................. H01L 21/6835
                                                257/686
7,838,337 B2 *  11/2010  Marimuthu ........... H01L 21/565
                                                257/E21.5

(Continued)

*Primary Examiner* — Luan C Thai
(74) *Attorney, Agent, or Firm* — Renaissance IP Law Group LLP

(57) ABSTRACT

Provided is a method of manufacturing a semiconductor package including a through wiring having precision and a low process defect. The semiconductor package includes an insulating substrate including a first through portion and a second through portion; a through wiring which fills the first through portion, and is located to penetrate the insulating substrate; a semiconductor chip which is located in the second through portion, and is electrically connected to the through wiring; a molding member molding the semiconductor chip and the insulating substrate; and a re-wiring pattern layer which is located at a lower side of the insulating substrate, and electrically connects the through wiring and the semiconductor chip.

21 Claims, 17 Drawing Sheets

(51) Int. Cl.
*H01L 23/00* (2006.01)
*H01L 23/538* (2006.01)
*H01L 21/56* (2006.01)
*H01L 23/31* (2006.01)
*H01L 23/498* (2006.01)
*H01L 25/065* (2006.01)

(52) U.S. Cl.
CPC ..... *H01L 23/3107* (2013.01); *H01L 23/49827* (2013.01); *H01L 23/5389* (2013.01); *H01L 24/08* (2013.01); *H01L 24/19* (2013.01); *H01L 24/24* (2013.01); *H01L 24/32* (2013.01); *H01L 24/82* (2013.01); *H01L 24/83* (2013.01); *H01L 24/89* (2013.01); *H01L 25/0655* (2013.01); *H01L 2224/0401* (2013.01); *H01L 2224/04105* (2013.01); *H01L 2224/08111* (2013.01); *H01L 2224/08235* (2013.01); *H01L 2224/12105* (2013.01); *H01L 2224/24101* (2013.01); *H01L 2224/24155* (2013.01); *H01L 2224/32235* (2013.01); *H01L 2225/06548* (2013.01); *H01L 2225/06572* (2013.01); *H01L 2225/107* (2013.01); *H01L 2225/1035* (2013.01); *H01L 2225/1041* (2013.01); *H01L 2225/1058* (2013.01); *H01L 2924/12042* (2013.01); *H01L 2924/171* (2013.01); *H01L 2924/181* (2013.01); *H01L 2924/18162* (2013.01)

(58) Field of Classification Search
CPC ................. 24/89;H01L 21/56; H01L 24/83; H01L 24/32
USPC ........................................................ 257/686
See application file for complete search history.

(56) References Cited

U.S. PATENT DOCUMENTS 8,216,918 B2 *  7/2012  Gong ................. H01L 21/6835
                                                    438/106
8,354,304 B2 *  1/2013  Chow ................. H01L 21/561
                                                    257/774

\* cited by examiner

SEMICONDUCTOR PACKAGE, FABRICATION METHOD THEREFOR, AND PACKAGE-ON PACKAGE

TECHNICAL FIELD

The following description relates to a semiconductor package, and more particularly, to a semiconductor package including a through wiring, a method of manufacturing the same, and a package on package (PoP).

BACKGROUND ART

With continuous developments of a process of manufacturing a semiconductor chip, a size of the semiconductor chip has continuously decreased. Currently, since the size of the semiconductor chip is greatly decreased, when forming a semiconductor package, it is necessary to increase a size of the semiconductor package for electrical connection. One of semiconductor package technologies proposed in the process of the developments is a fan-out package. Further, technology expanding a memory capacity or improving operating performance of a semiconductor chip in the same installation dimension by forming a pattern structure transferring a signal in a vertical direction in an outer region of the fan-out package and stacking packages of the same kind or packages of different kinds has also been developed in various types.

A conventional art forms a hole in an outer molding region of the semiconductor chip in order to connect an electrical signal vertically, fills a conductive paste therein, and forms a through pattern having a vertical shape. After this, the conventional art forms a horizontal pattern which is electrically connected to the through pattern and is formed in the upper and/or lower surface of the outer molding region. However, the conventional art generates various process defects due to damage of a surface of a chip pad or penetration of a molding material, etc. during a manufacturing process. Further, the conventional art has limitations that it is difficult to precisely form the through hole for forming the through pattern which is formed in the molding region of the semiconductor chip and densely fill the through hole with a conductive material. There is U.S. Pat. No. 7,545,047 as a prior art document.

DISCLOSURE

Technical Problem

The present invention is directed to providing a semiconductor package including a through wiring having precision and a low process defect, a method of manufacturing the same, and a package on package (PoP).

Technical Solution

One aspect of the present invention provides a semiconductor package, including: an insulating substrate including a first through portion and a second through portion; a through wiring which fills the first through portion, and is located to penetrate the insulating substrate; a semiconductor chip which is located in the second through portion, and is electrically connected to the through wiring; a molding member molding the semiconductor chip and the insulating substrate; and a re-wiring pattern layer which is located at a lower side of the insulating substrate, and electrically connects the through wiring and the semiconductor chip.

Another aspect of the present invention provides a semiconductor package, including: an insulating substrate including a first through portion and a second through portion; a through wiring which fills the first through portion, and is located to penetrate the insulating substrate; an upper pad which is located on an upper surface of the insulating substrate, and is electrically connected to an upper surface of the through wiring; a lower pad which is located on a lower surface of the insulating substrate, and is electrically connected to a lower side of the through wiring; a semiconductor chip which is located in the second through portion, and is electrically connected to the through wiring; a molding member molding the semiconductor chip and the insulating substrate; and a re-wiring pattern layer which is located at a lower side of the insulating substrate, and electrically connects the through wiring and the semiconductor chip. A lower surface of the semiconductor chip may be recessed to have a step difference with respect to a lower surface of the lower pad.

In an embodiment, the lower surface of the semiconductor chip may be recessed to have a step difference with respect to the lower surface of the insulating substrate.

In an embodiment, the lower surface of the semiconductor chip may be recessed to have a step difference in the range of 3 to 23 μm with respect to the lower surface of the insulating substrate.

In an embodiment, the re-wiring pattern layer may include a first insulating layer exposing the through wiring and a semiconductor chip pad of the semiconductor chip on the insulating substrate and the through wiring; a re-wiring pattern which is located on the first insulating layer, and electrically connects the through wiring and the semiconductor chip pad; and a second insulating layer which is located on the re-wiring pattern, and exposes a portion of the re-wiring pattern. A thickness of the first insulating layer which is in contact with the semiconductor chip may be greater than a thickness of the first insulating layer which is in contact with the insulating substrate.

In an embodiment, the thickness of the first insulating layer which is in contact with the semiconductor chip may be greater in the range of 3 to 23 μm than the thickness of the first insulating layer which is in contact with the insulating substrate.

In an embodiment, the semiconductor package may further include an external connection member which is located at a lower side of the re-wiring pattern layer, and is electrically connected to the re-wiring pattern layer.

In an embodiment, the semiconductor package may further include an external connection member which is located at an upper side of the upper pad, and is electrically connected to the upper pad.

In an embodiment, the upper pad, the lower pad, or both thereof may have a greater width than the through wiring.

In an embodiment, the semiconductor chip may have a smaller height than the insulating substrate.

In an embodiment, the semiconductor chip may have the same height as the insulating substrate.

In an embodiment, the semiconductor chip may have a greater height than the insulating substrate.

In an embodiment, the top surface of the semiconductor chip may be located in the same plane as the top surface of the insulating substrate.

In an embodiment, the top surface of the semiconductor chip may be located in the same plane as the top surface of the molding member.

In an embodiment, the top surface of the semiconductor chip may be exposed from the molding member.

In an embodiment, the semiconductor chip may include a plurality of semiconductor chips.

Still another aspect of the present invention provides a semiconductor package, including: an insulating substrate including one or more first through portions and a second through portion located between the first through portions; one or more through wirings which fill the first through portions, and are located to penetrate the insulating substrate; an upper pad which is located on an upper surface of the insulating substrate, and is electrically connected to an upper side of each of the through wirings; a lower pad which is located on a lower surface of the insulating substrate, and is electrically connected to a lower side of each of the through wirings; a semiconductor chip which is located in the second through portion and between the through wirings, and is electrically connected to the through wirings; a molding member molding the semiconductor chip and the insulating substrate; and a re-wiring pattern layer which is located at a lower side of the insulating substrate, and electrically connects the through wirings and the semiconductor chip. The rewiring pattern layer may include a first insulating layer exposing the through wirings and a semiconductor chip pad of the semiconductor chip on the insulating substrate and the through wirings; a re-wiring pattern which is located on the first insulating layer, and electrically connects the through wirings and the semiconductor chip pad; and a second insulating layer which is located on the re-wiring pattern, and exposes a portion of the rewiring pattern. A lower surface of the semiconductor chip may be recessed to have a step difference with respect to a lower surface of the lower pad, and a thickness of the first insulating layer which is in contact with the semiconductor chip may be greater than a thickness of the first insulating layer which is in contact with the insulating substrate.

Yet another aspect of the present invention provides a method of manufacturing a semiconductor package, including: preparing a semiconductor chip and an insulating substrate; forming a protective layer on a lower surface of the semiconductor chip; forming a through wiring in a first through portion of the insulating substrate; forming an upper pad on an upper surface of the through wiring, and forming a lower pad on a lower surface of the through wiring; arranging the semiconductor chip in a second through portion of the insulating substrate; forming a molding member covering the insulating substrate and the semiconductor chip; removing the protective layer from the semiconductor chip; and forming a re-wiring pattern layer which electrically connects the through wiring and the semiconductor chip. The lower surface of the semiconductor chip may be recessed to have a step difference with respect to a lower surface of the lower pad.

In an embodiment, the arranging of the semiconductor chip in the second through portion of the insulating substrate may include bonding the insulating substrate on a carrier substrate; and bonding the semiconductor chip in the second through portion of the insulating substrate on the carrier substrate.

In an embodiment, the forming of the re-wiring pattern layer which electrically connects the through wiring and the semiconductor chip may further include forming a first insulating layer exposing the through wiring and a semiconductor chip pad of the semiconductor chip on the insulating substrate and the through wiring; forming a re-wiring pattern which electrically connects the through wiring and the semiconductor chip pad on the first insulating layer; and forming a second insulating layer exposing a portion of the re-wiring pattern on the re-wiring pattern. A thickness of the first insulating layer which is in contact with the semiconductor chip may be greater than a thickness of the first insulating layer which is in contact with the insulating substrate.

In an embodiment, the forming of the molding member may include forming a molding member which entirely covers the insulating substrate and the semiconductor chip; exposing the upper pad by removing a portion of the molding member using an etching process or laser ablation process; cleansing the exposed upper pad; and processing a surface of the exposed upper pad using Ni/Au electroless plating, Ni/Sn plating, or Sn plating.

Yet another aspect of the present invention provides a package on package, including: a lower semiconductor package, including; a lower insulating substrate including a first through portion and a second through portion, a lower through wiring which fills the first through portion and is located to penetrate the lower insulating substrate, a first pad which is located on an upper surface of the lower insulating substrate and is electrically connected to an upper side of the lower through wiring, a second pad which is located on a lower surface of the lower insulating substrate and is electrically connected to a lower side of the lower through wiring, a lower semiconductor chip which is located in the second through portion and is electrically connected to the lower through wiring, a lower molding member molding the lower semiconductor chip and the lower insulating substrate, and a lower re-wiring pattern layer which is located at a lower side of the lower insulating substrate and electrically connects the lower through wiring and the lower semiconductor chip, wherein a lower surface of the lower semiconductor chip is recessed to have a step difference with respect to the lower surface of the second pad, and an upper semiconductor package, including; an upper insulating substrate including a third through portion and a fourth through portion, an upper through wiring which fills the third through portion and is located to penetrate the upper insulating substrate, a third pad which is located on an upper surface of the upper insulating substrate and is electrically connected to an upper side of the upper through wiring, a fourth pad which is located at a lower side of the upper insulating substrate and is electrically connected to a lower surface of the upper through wiring, an upper semiconductor chip which is located in the fourth through portion and is electrically connected to the upper through wiring, an upper molding member molding the upper semiconductor chip and the upper insulating substrate, and an upper re-wiring pattern layer which is located on the lower surface of the upper insulating substrate and electrically connects the upper through wiring and the upper semiconductor chip, wherein a lower surface of the upper semiconductor chip is recessed to have a step difference with respect to a lower surface of the fourth pad. The upper semiconductor package may be located at an upper side of the lower semiconductor package, and an upper external connection member of the upper semiconductor package may be electrically connected to the lower through wiring of the lower semiconductor package.

Yet another aspect of the present invention provides a semiconductor package, including: an insulating substrate including a first through portion and a second through portion; a through wiring which fills the first through portion and is located to penetrate the insulating substrate; a semiconductor chip which is located in the second through portion and is electrically connected to the through wiring; a molding member molding the semiconductor chip and the insulating substrate, and having a recess region exposing the top side of the through wiring; a re-wiring pattern layer which is located at a lower side of the insulating substrate and electrically connects the through wiring and the semiconductor chip; and an external connection member which is electrically connected to the re-wiring pattern layer.

In an embodiment, the semiconductor package may further include a bonding layer which is located on the through wiring in the recess region of the molding member.

In an embodiment, the bonding layer may include a conductive material.

In an embodiment, the top surface of the bonding layer may be recessed to have a step difference with respect to the top surface of the molding member.

In an embodiment, the semiconductor chip may have a smaller height than the insulating substrate.

In an embodiment, the semiconductor chip may have the same height as the insulating substrate.

In an embodiment, the semiconductor chip may have a greater height than the insulating substrate.

In an embodiment, the top surface of the semiconductor chip may be located in the same plane as the top surface of the insulating substrate.

In an embodiment, the top surface of the semiconductor chip may be located in the same plane as the top surface of the molding member.

In an embodiment, the top surface of the semiconductor chip may be exposed from the molding member.

In an embodiment, the semiconductor chip may include a plurality of semiconductor chips.

Yet another aspect of the present invention provides a method of manufacturing a semiconductor package, including: preparing an insulating substrate; forming a through wiring in a first through portion of the insulating substrate; arranging a semiconductor chip in a second through portion of the insulating substrate; forming a molding member covering the insulating substrate and the semiconductor chip; forming a re-wiring pattern layer which electrically connects the through wiring and the semiconductor chip; forming an external connection member which is electrically connected to the re-wiring pattern layer; and forming a recess region exposing the through wiring by removing a portion of the molding member.

In an embodiment, the forming of the through wiring in the insulating substrate may include: simultaneously forming the first through portion and the second through portion by removing a portion of the insulating substrate; and forming the through wiring by filling the first through portion with a conductive material.

In an embodiment, the forming of the through wiring in the insulating substrate may include: forming the first through portion by removing one portion of the insulating substrate; forming the through wiring by filling the first through portion with a conductive material; and forming the second through portion by removing another portion of the insulating substrate.

In an embodiment, the first through portion and the second through portion may be formed using a routing process, a mold cutting process, an etching process, a drilling process, or a laser ablation process.

In an embodiment, the arranging of the semiconductor chip in the second through portion of the insulating substrate may include: bonding the insulating substrate on a carrier substrate; and bonding the semiconductor chip in the second through portion of the insulating substrate on the carrier substrate.

In an embodiment, the semiconductor package may further include: after performing the forming of the recess region exposing the through wiring by removing the portion of the molding member, forming a bonding layer which is electrically connected to the through wiring in the recess region.

In an embodiment, the bonding layer may have a smaller planar dimension than the through wiring.

In an embodiment, the forming of the re-wiring pattern layer which electrically connects the through wiring and the semiconductor chip may further include: forming a first insulating layer exposing the through wiring and a semiconductor chip pad of the semiconductor chip on the insulating substrate and the through wiring; forming a re-wiring pattern which electrically connects the through wiring and the semiconductor chip pad on the first insulating layer; and forming a second insulating layer exposing a portion of the re-wiring pattern on the re-wiring pattern.

Yet another aspect of the present invention provides a package on package, including: a lower semiconductor package, including; a lower insulating substrate including a first through portion and a second through portion, a lower through wiring which fills the first through portion and is located to penetrate the lower insulating substrate, a lower semiconductor chip which is located in the second through portion and is electrically connected to the lower through wiring, a lower molding member molding the lower semiconductor chip and the lower insulating substrate and including a lower recess region exposing the top side of the lower through wiring, a lower re-wiring pattern layer which is located at a lower side of the lower insulating substrate and electrically connects the lower through wiring and the lower semiconductor chip, and a lower external connection member which is electrically connected to the lower re-wiring pattern layer, and an upper semiconductor package, including; an upper insulating substrate including a third through portion and a fourth through portion, an upper through wiring which fills the third through portion and is located to penetrate the upper insulating substrate, an upper semiconductor chip which is located in the fourth through portion and is electrically connected to the upper through wiring, an upper molding member molding the upper semiconductor chip and the upper insulating substrate, an upper re-wiring pattern layer which is located at a lower side of the upper insulating substrate and electrically connects the upper through wiring and the upper semiconductor chip, and an upper external connection member which is electrically connected to the upper re-wiring pattern layer. The upper semiconductor package may be located at an upper side of the lower semiconductor package. The upper external connection member of the upper semiconductor package may be electrically connected to the lower through wiring of the lower semiconductor package.

Advantageous Effects

Unlike a conventional art installing a semiconductor chip, forming a through hole, filling the through hole, and forming a through wiring, since the semiconductor package according to the spirit of the present invention previously forms the through hole in an insulating substrate, forms the through wiring by filling the through hole, and installs the semiconductor chip, the through wiring capable of reducing damage with respect to the semiconductor chip during a manufacturing process and having precision and a low process defect can be provided.

Further, since a protective layer is formed on an activation surface of the semiconductor chip, defects occurred in the processing of the activation surface of the semiconductor chip in an individualization process of the semiconductor chip, an installation process and a molding process on a carrier substrate, for example, defects such as damage of the activation surface of the semiconductor chip, contamination of pads of the semiconductor chip, coverage of a pad surface of a molding member, etc. can be prevented.

Moreover, since a semiconductor chip pad of the semiconductor chip is formed in a different plane from a lower pad connected to the through wiring by the protective layer, signal interference can be suppressed. A height of the lower pad can be adjusted by controlling a thickness of an insulating layer located on the semiconductor chip and insulating substrate, and electrical and mechanical characteristics of the semiconductor package can be controlled.

MODES OF THE INVENTION

Figure 1:
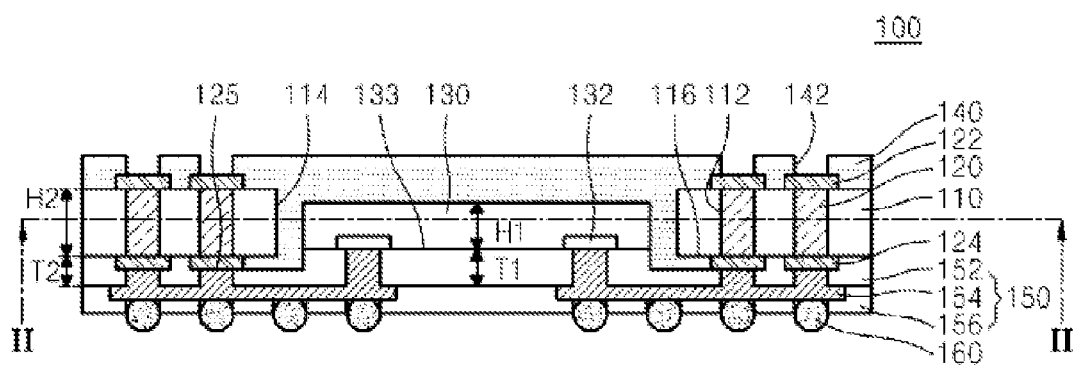
FIG. 1 is a cross-sectional view illustrating a semiconductor package according to one embodiment of the present invention.

The semiconductor package according to an embodiment of the present invention includes an insulating substrate 110 including a first through portion 112 and a second through portion 114; a through wiring 120 which fills the first through portion 112, and is located to penetrate the insulating substrate 110; a semiconductor chip 130 which is located in the second through portion 114, and is electrically connected to the through wiring 120; a molding member 140 molding the semiconductor chip 130 and the insulating substrate 110; and a re-wiring pattern layer 150 which is located at a lower side of the insulating substrate 110, and electrically connects the through wiring 120 and the semiconductor chip 130.

Hereinafter, preferred embodiments of the present invention will be described with reference to accompanying drawings. Embodiments of the present invention are provided to describe more fully the spirit of the present invention to those skilled in the art, but the spirit of the present invention is not limited thereto. Rather, the embodiments are provided to describe more faithfully and fully disclosure of the invention, and to describe more completely the spirit of the invention to those skilled in the art. As used herein, the term "and/or" includes any and all combinations of one or more of the associated listed items. The same numeral may always mean the same component. Further, various components and regions are schematically illustrated in the drawings. Accordingly, the spirit of the present invention is not limited by a relative size or interval shown in the accompanying drawings.

Figure 2:
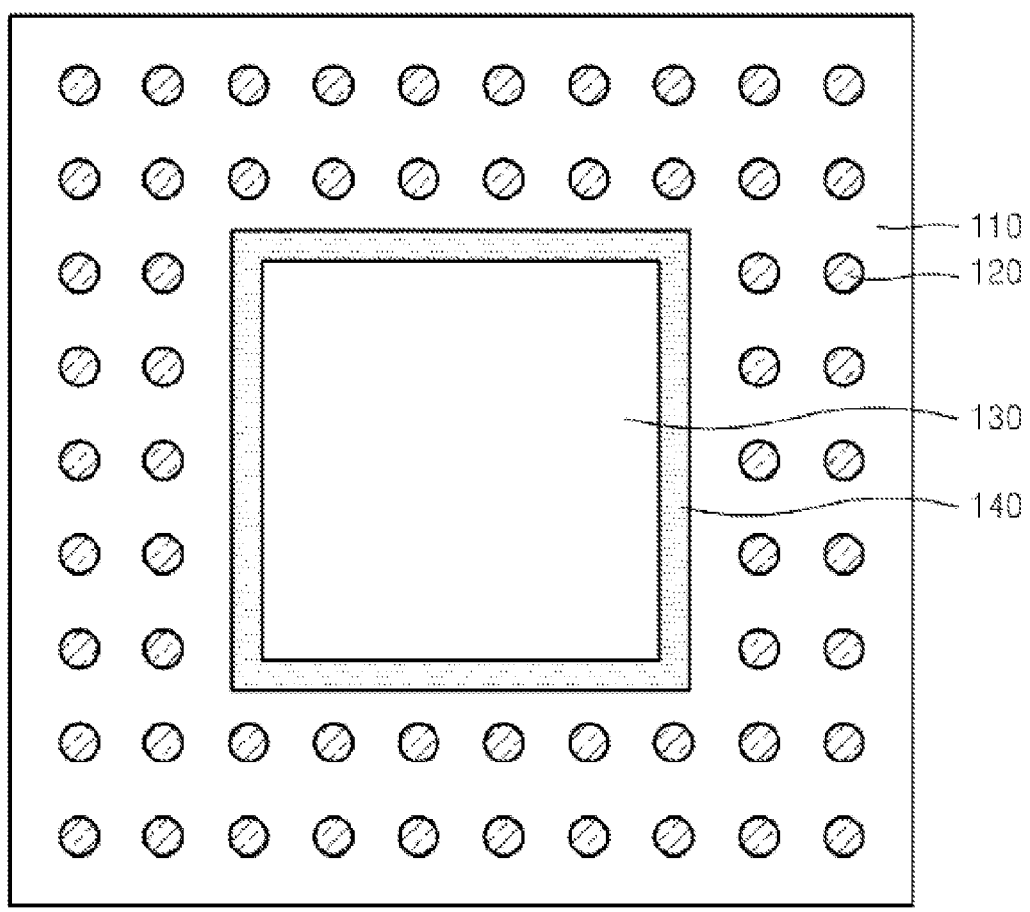
FIG. 2 is a plan view taken along line II-II' of the semiconductor package of FIG. 1 according to one embodiment of the present invention.

FIG. 1 is a cross-sectional view illustrating a semiconductor package 100 according to one embodiment of the present invention. FIG. 2 is a plan view taken along line II-II' of the semiconductor package 100 of FIG. 1 according to one embodiment of the present invention.

Referring to FIGS. 1 and 2, the semiconductor package 100 may include an insulating substrate 110, a through wiring 120, an upper pad 122, a lower pad 124, a semiconductor chip 130, a molding member 140, a re-wiring pattern layer 150, and an external connection member 160.

The insulating substrate 110 may include a first through portion 112 and a second through portion 114. The second through portion 114 may be located in the center portion of the insulating substrate 110, and the first through portion 112 may be located around the second through portion 114. The through wiring 120 may be formed by filling the first through portion 112 with a conductive material. The semiconductor chip 130 may be located in the second through portion 114. However, positions of the first through portion 112 and the second through portion 114 may be variably changed. For example, the second through portion 114 may be located at one end or a corner of the insulating substrate 110, and the first through portion 112 may be located outside the second through portion 114 in order not to surround the second through portion 114 completely.

The through wiring 120 may be located to penetrate the insulating substrate 110. The upper pad 122 may be located at an upper side of the through wiring 120 to be electrically connected with the through wiring 120. Further, the lower pad 124 may be located at a lower side of the through wiring 120 to be electrically connected to the through wiring 120. That is, the upper pad 122 may be located on an upper surface of the insulating substrate 110, and the lower pad 124 may be located on a lower surface of the insulating substrate 110. The through wiring 120 may be electrically connected to the semiconductor chip 130 by the lower pad 124 and the re-wiring pattern layer 150. That is, the through wiring 120 may be electrically connected to a semiconductor chip pad 132 of the semiconductor chip 130 by the lower pad 124 and a re-wiring pattern 154. The through wiring 120 may provide a data signal or a power signal to the semiconductor chip 130.

The semiconductor chip 130 may be located in the center of the insulating substrate 110, and the through wiring 120 may be located outside the semiconductor chip 130. The semiconductor chip 130 may be a memory chip or a logic chip. For example, the memory chip may include a dynamic random access memory (DRAM), a static random access memory (SRAM), a flash, a phase change RAM (PRAM), a resistance memory (ReRAM), a ferroelectric RAM (FeRAM), or a magnetic random access memory (MRAM). The logic chip may be a controller controlling memory chips. The logic chip may be a controller controlling memory chips. A height H1 of the semiconductor chip 130 may be smaller than a height H2 of the insulating substrate 110. Accordingly, the height H1 of the semiconductor chip 130 may be smaller than a height of the through wiring 120.

The molding member 140 may seal the semiconductor chip 130. The semiconductor chip pad 132 of the semiconductor chip 130 may be exposed from the molding member 140. The molding member 140 may cover the top surface of the insulating substrate 110, and a side surface of the insulating substrate 110 may be exposed from the molding member 140. The molding member 140 may have a recess region 142 exposing the upper pad 122. The molding member 140 may fill a space between the semiconductor chip 130 and the insulating substrate 110. Further, the molding member 140 may be extended to fill a space between the insulating substrate 110 and a first insulating layer 152 of the re-wiring pattern layer 150. The molding member 140 may include an insulating material, for example, an epoxy mold compound (EMC). The exposed upper pad 122 may further include a plating layer formed by Ni/Au electroless plating, Ni/Sn plating, or Sn plating, etc.

The re-wiring pattern layer 150 may be located at a lower side of the insulating substrate 110. The re-wiring pattern layer 150 may support the semiconductor chip 130. The first insulating layer 152, the re-wiring pattern 154, and a second insulating layer 156 may constitute the re-wiring pattern layer 150. The re-wiring pattern 154 may be surrounded by the first insulating layer 152 and the second insulating layer 156. The re-wiring pattern 154 may include a conductive material, for example, a metal such as copper, copper alloys, aluminum, or aluminum alloys. The re-wiring pattern 154 may rewire the semiconductor chip 130. Accordingly, the re-wiring pattern 154 may miniaturize input and output terminals of the semiconductor chip 130, and also increase the number of the input and output terminals of the semiconductor chip 130. Further, the semiconductor package 100 may have a fan-out structure by the re-wiring pattern 154.

Further, the re-wiring pattern layer 150 may have a previously manufactured structure, and an example in which the structure is bonded to the semiconductor chip 130 and the molding member 140 by a pressing process, a bonding process, a reflow process, etc. may be included in the spirit of the present invention.

A lower surface 133 of the semiconductor chip 130 may not be located in the same plane as a lower surface 125 of the lower pad 124 and/or a lower surface 116 of the insulating substrate 110. For example, the lower surface 133 of the semiconductor chip 130 may be recessed to have a step difference with respect to the lower surface 125 of the lower pad 124, or to have a step difference with respect to the lower surface 116 of the insulating substrate 110. For example, the lower surface 133 of the semiconductor chip 130 may be recessed to have the step difference in the range of 1 to 50 μm, for example, 3 to 23 μm, with respect to the lower surface 125 of the lower pad 124 and/or the lower surface 116 of the insulating substrate 110.

Further, a thickness T1 of the first insulating layer 152 which is in contact with the semiconductor chip 130 may be greater than a thickness T2 of the first insulating layer 152 which is in contact with the insulating substrate 110. For example, the thickness T1 of the first insulating layer 152 which is in contact with the semiconductor chip 130 may be greater by a thickness corresponding to a thickness of a removed protective layer 139 than the thickness T2 of the first insulating layer 152 which is in contact with the insulating substrate 110. For example, the thickness T1 of the first insulating layer 152 which is in contact with the semiconductor chip 130 may be greater in the range of 1 to 50 μm, for example, 3 to 23 μm, than the thickness T2 of the first insulating layer 152 which is in contact with the insulating substrate 110. Accordingly, the re-wiring pattern layer 150 may have a greater thickness at a lower side of the semiconductor chip 130 than the lower side of the insulating substrate 110.

The external connection member 160 may be electrically and/or physically connected with the re-wiring pattern 154, and thus be electrically connected to the semiconductor chip 130 and/or the through wiring 120. The external connection member 160 may electrically connect the semiconductor chip 130 and an external device. The external connection member 160 may be located in the same vertical location as the through wiring 120. Accordingly, as described below with reference to FIG. 19, the external connection member 160 of one semiconductor package and the through wiring of another semiconductor package may be electrically and/or physically connected to each other. The external connection member 160 may be located outside the semiconductor chip 130. However, this is an example, and the spirit of the present invention is not limited thereto, and an example in which the external connection member 160 is located to overlap the semiconductor chip 130 may be included in the spirit of the present invention. For example, the external connection member 160 may be a solder ball.

FIGS. 3 to 18 are cross-sectional views for describing a method of manufacturing the semiconductor package 100 of FIG. 1 according to an embodiment of the present invention in process sequence.

Figure 3:
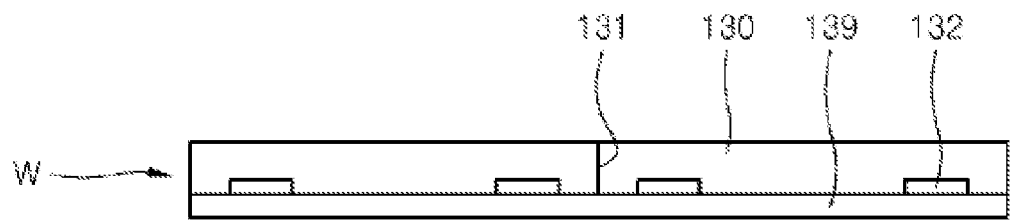
FIGS. 3 to 18 are cross-sectional views for describing a method of manufacturing the semiconductor package of FIG. 1 according to one embodiment of the present invention in process sequence.

Referring to FIG. 3, the protective layer 139 may be formed at a lower side of a semiconductor wafer W including a plurality of semiconductor chips 130. The protective layer 139 may be formed on a lower surface of the semiconductor chip 130. The lower surface may be an activation surface in which circuit structures (not shown) are formed, and the semiconductor chip pad 132 may be located in the lower surface. That is, the semiconductor chip pad 132 may be protected by the protective layer 139 during a manufacturing process. Further, the circuit structures (not shown) may be protected by the protective layer 139 during the manufacturing process.

The protective layer 139 may be a material formed by hardening after coating a liquid material. Further, the protective layer 139 may be a material formed by a deposition method. The protective layer 139 may include an insulating material, for example, an oxide, nitride, or oxynitride. For example, the protective layer 139 may have a thickness in the range of 1 to 50 μm, for example, 3 to 23 μm. However, a material, a shape, and a thickness of the protective layer 139 may be only an example, and the spirit of the present invention is not limited thereto.

Figure 4:
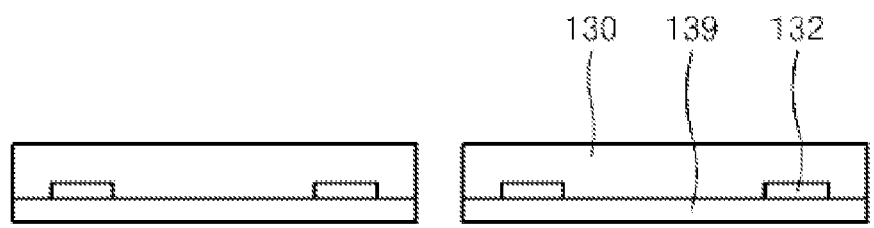

Referring to FIG. 4, the semiconductor chip 130 may be individualized by cutting the semiconductor wafer W along a scribe line 131. Accordingly, the individualized semiconductor chip 130 may be covered by the protective layer 139, and the lower surface of the semiconductor chip 130 in which the semiconductor chip pad 132 is located may be covered by the protective layer 139.

Figure 5:
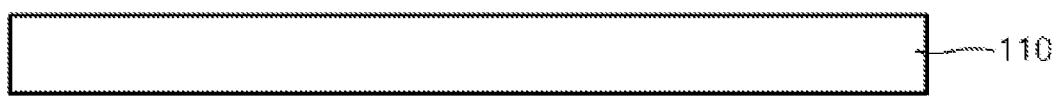

Referring to FIG. 5, the insulating substrate 110 may be prepared. The insulating substrate 110 may include an insulating material, for example, silicon, glass, ceramic, plastic, or a polymer. The insulating substrate 110 may have a planar shape, a circular shape, or a polygonal shape.

Figure 6:

Referring to FIG. 6, the first through portion 112 penetrating the insulating substrate 110 may be formed by removing a portion of the insulating substrate 110. A process of forming the first through portion 112 may be a routing process, a mold cutting process, an etching process, a drilling process, or a laser ablation process. The first through portion 112 may be located to correspond to a region in which the through wiring 120 is formed by a subsequent process. A dotted line shown in FIG. 6 is only illustrated to clearly indicate the first through portion 112, and does not mean that the insulating substrate 110 is divided into several parts.

Figure 7:
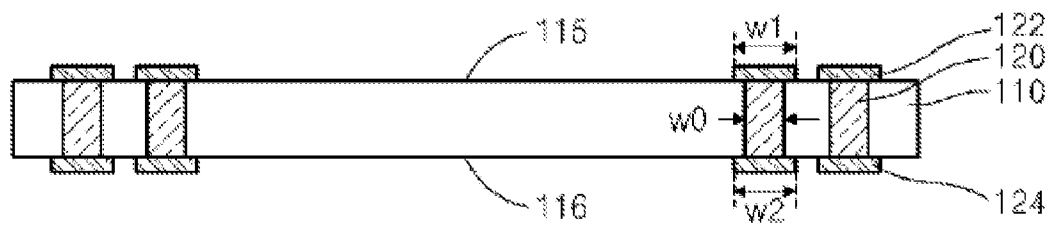

Referring to FIG. 7, the through wiring 120 may be formed in the insulating substrate 110. Specifically, the through wiring 120 may be formed by filling the first through portion 112 with a conductive material. The through wiring 120 may be a through silicon via (TSV) or a through substrate via (TSV). The through wiring 120 may include a conductive material, and may be formed by hardening after filling the first through portion 112 with a conductive paste having liquidity. The conductive paste may be a mixture of a metal powder and/or a carbon powder, and a liquid resin. Alternatively, the through wiring 120 may be formed by filling the first through portion 112 with the conductive material using a plating process or a deposition process. For example, the through wiring 120 may include a metal such as copper, copper alloys, aluminum, or aluminum alloys. Further, the through wiring 120 may include carbon.

The upper pad 122 may be formed in an upper surface 115 of the insulating substrate 110, and the lower pad 124 may be formed in the lower surface 116 of the insulating substrate 110. The upper pad 122 and the lower pad 124 may be extended from the through wiring 120, and be electrically connected with the through wiring 120. Further, a width w1 of the upper pad 122 may be greater than a width w0 of the through wiring 120. A width w2 of the lower pad 124 may be greater than the width w0 of the through wiring 120. The width w1 of the upper pad 122 and the width w2 of the lower pad 124 may be equal or different. The upper pad 122 and/or the lower pad 124 may be formed using a plating process, a deposition process, or a printing process. The upper pad 122 and/or the lower pad 124 may include a conductive material, for example, a metal such as copper, copper alloys, aluminum, or aluminum alloys. The upper pad 122 and/or the lower pad 124 may include the same material as or a different material with the through wiring 120. Thicknesses of the upper pad 122 and/or the lower pad 124 may be variably changed.

Figure 8:
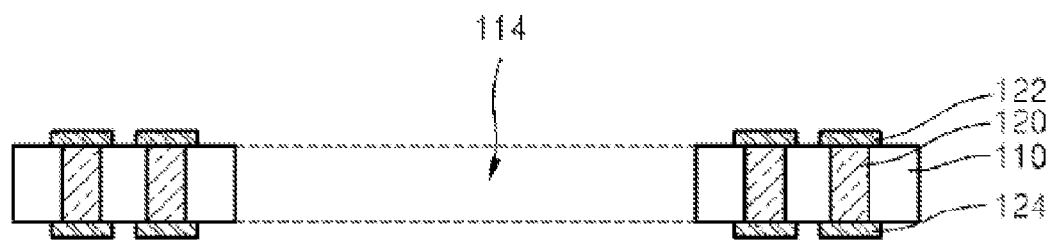

Referring to FIG. 8, the second through portion 114 penetrating the insulating substrate 110 may be formed by removing a portion of the insulating substrate 110. A process of forming the second through portion 114 may be performed using a routing process, a mold cutting process, an etching process, a drilling process, or a laser ablation process. The second through portion 114 may be located to correspond to a region in which the semiconductor chip 130 is located by a subsequent process. The second through portion 114 may be located in the center of the insulating substrate 110, and the through wiring 120 formed in the first through portion 112 may be located around the second through portion 114. However, positions of the first through portion 112 and the second through portion 114 may be variably changed. For example, the second through portion 114 may be located at one end or the corner of the insulating substrate 110, and the first through portion 112 may located outside the second through portion 114 in order not to surround the second through portion 114 completely. A dotted line shown in FIG. 8 is only illustrated to clearly indicate the second through portion 114, and does not mean that the insulating substrate 110 is divided into several parts.

In this embodiment, an example in which the first through portion 112 and the second through portion 114 are formed in a different process has been described, but this is only an example, and an example in which the first through portion 112 and the second through portion 114 are formed in the same process may be included in the spirit of the present invention.

Figure 9:
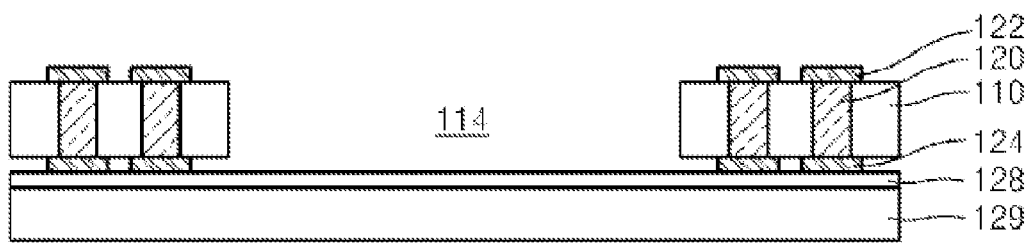

Referring to FIG. 9, the insulating substrate 110 may be bonded on a carrier substrate 129. For example, the insulating substrate 110 may be bonded on the carrier substrate 129 using an adhesive member 128. The carrier substrate 129 may include silicon, glass, ceramic, plastic, or a polymer. The adhesive member 128 may be a liquid adhesive or an adhesive tape. The adhesive member 128 may be exposed to the second through portion 114 of the insulating substrate 110. In FIG. 9, the adhesive member 128 is bonded only to the lower pad 124, and is illustrated to be spaced apart from the insulating substrate 110, but the adhesive member 128 may be bonded to the insulating substrate 110 in a region in which the lower pad 124 is not located.

Figure 10:
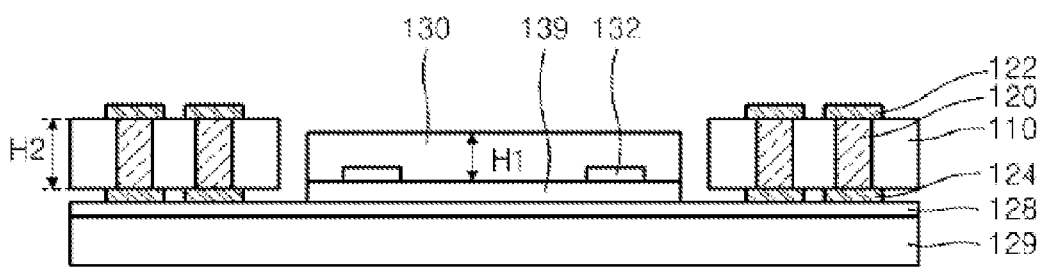

Referring to FIG. 10, the semiconductor chip 130 may be arranged in the insulating substrate 110. Specifically, the semiconductor chip 130 may be bonded to locate inside the second through portion 114 of the insulating substrate 110 on the carrier substrate 129. The semiconductor chip pad 132 of the semiconductor chip 130 may be arranged to face the carrier substrate 129, and the protective layer 139 may be in contact with the adhesive member 128. The semiconductor chip 130 and the insulating substrate 110 may be located to be spaced apart from each other in a lateral direction. That is, the second through portion 114 may have a greater planar dimension than the semiconductor chip 130. Alternatively, the semiconductor chip 130 and the insulating substrate 110 may locate to be in contact with each other in a lateral direction. For example, the second through portion 114 may have almost the same planar dimension as the semiconductor chip 130. The height H1 of the semiconductor chip 130 may be smaller than the height H2 of the insulating substrate 110. Further, the top surface of the semiconductor chip 130 may have a step difference with respect to the top surface of the insulating substrate 110. However, this is only an example, and the spirit the present invention is not limited thereto. For example, the height H1 of the semiconductor chip 130 may be equal to or greater than the height H2 of the insulating substrate 110.

The through wiring 120 may be located to surround the semiconductor chip 130. The number of the through wirings 120 to be located around both sides of the semiconductor chip 130 may be the same. However, this is only an example, and the spirit of the present invention is not limited thereto. For example, the through wiring 120 may be only located around one side of the semiconductor chip 130 or the number of the through wirings 120 to be located around the semiconductor chip 130 may be different. Further, an example in which two through wirings 120 are located around the both sides of the semiconductor chip 130 is illustrated, but this is only an example, and the spirit of the present invention is not limited thereto. That is, the number of the through wirings 120 to be located around the both sides of the semiconductor chip 130 may be variably changed.

Figure 11:
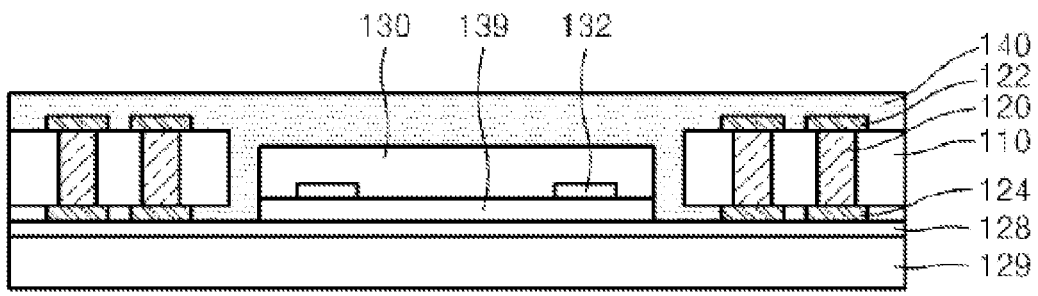

Referring to FIG. 11, the molding member 140 covering the insulating substrate 110 and the semiconductor chip 130 may be formed. The molding member 140 may seal the semiconductor chip 130 and the protective layer 139. The top surface of the insulating substrate 110 may be covered by the molding member 140, and a side surface of the insulating substrate 110 may be exposed from the molding member 140. Further, the through wiring 120 and the upper pad 122 may be covered by the molding member 140. The molding member 140 may fill a space between the semiconductor chip 130 and the insulating substrate 110. The molding member 140 may include an insulating material, for example, an EMC. A process of forming the molding member 140 may be performed in a singular operation or a plurality of operations. Optionally, a process of planarizing the top surface of the molding member 140 may be performed. The molding member 140 may be formed using a printing method or a compression molding method.

Figure 12:
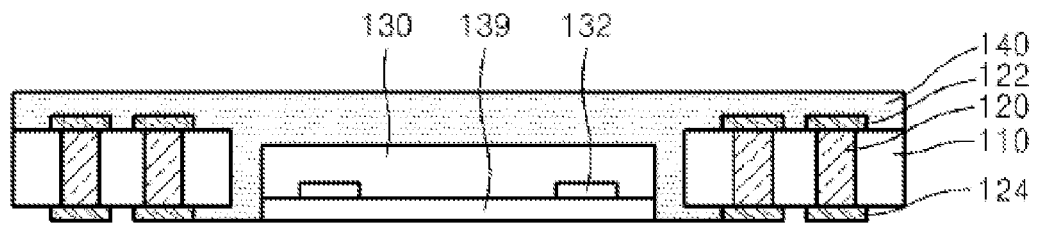

Referring to FIG. 12, the carrier substrate 129 and the adhesive member 128 may be removed. Accordingly, the protective layer 139 covering the semiconductor chip pad 132 of the semiconductor chip 130 and the lower pad 124 connected to the through wiring 120 may be exposed from the molding member 140.

Figure 13:
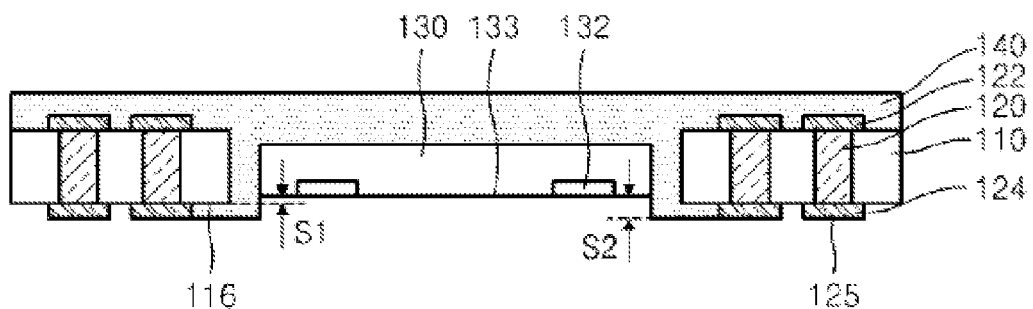

Referring to FIG. 13, the protective layer 139 covering the semiconductor chip pad 132 of the semiconductor chip 130 may be removed. Accordingly, the semiconductor chip pad 132 of the semiconductor chip 130 may be exposed from the molding member 140. The lower surface 133 of the semiconductor chip 130 in which the semiconductor chip pad 132 is located may be recessed by a first distance S1 from the lower surface 125 of the lower pad 124. The lower surface 133 of the semiconductor chip 130 may be recessed by a second distance S2 from the lower surface 116 of the insulating substrate 110. Specifically, the lower surface 133 of the semiconductor chip 130 may not be located in the same plane as the lower surface 125 of the lower pad 124 and/or the lower surface 116 of the insulating substrate 110. That is, the lower surface 133 of the semiconductor chip 130 may be recessed to have a step difference corresponding to a thickness of the removed protective layer 139 with respect to the lower surface 125 of the lower pad 124 and/or the lower surface 116 of the insulating substrate 110. For example, the lower surface 133 of the semiconductor chip 130 may be recessed in the range of 1 to 50 μm, for example, 3 to 23 μm, with respect to the lower surface 125 of the lower pad 124 and/or the lower surface 116 of the insulating substrate 110.

Figure 14:
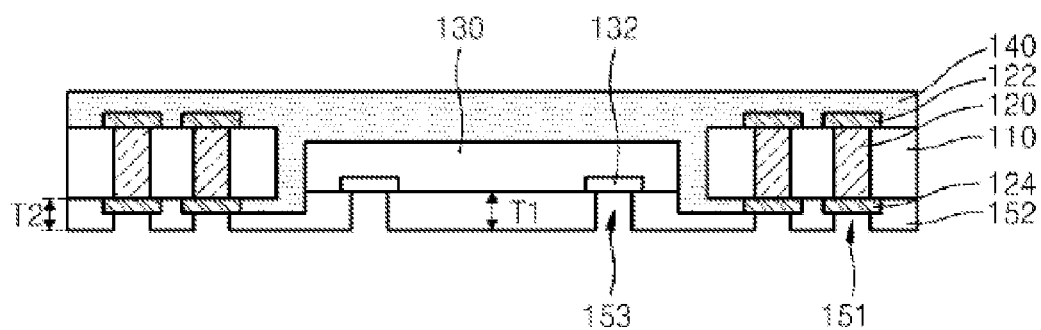
Figure 15:
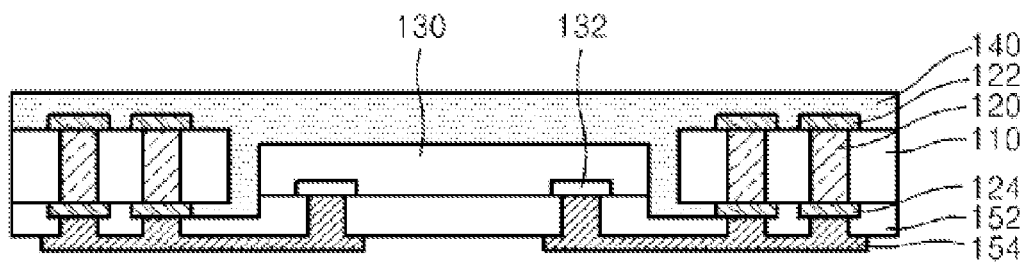
Figure 16:
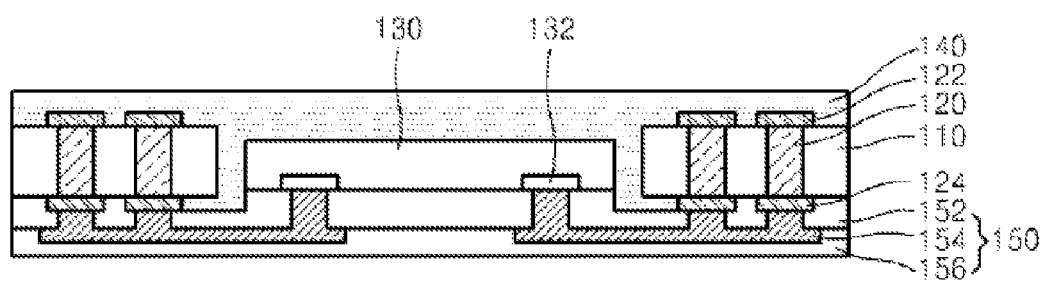

Referring to FIGS. 14 to 16, the re-wiring pattern layer 150 electrically connecting the through wiring 120 and the semiconductor chip 130 may be formed.

Referring to FIG. 14, the first insulating layer 152 may be formed on the insulating substrate 110 and the through wiring 120. The first insulating layer 152 may be extended on the semiconductor chip 130. Specifically, the first insulating layer 152 and the molding member 140 may be located to face on both surfaces of the insulating substrate 110. The thickness T1 of the first insulating layer 152 which is in contact with the semiconductor chip 130 may be greater than the thickness T2 of the first insulating layer 152 which is in contact with the insulating substrate 110. For example, the thickness T1 of the first insulating layer 152 which is in contact with the semiconductor chip 130 may be greater by a thickness corresponding to a thickness of the removed protective layer 139 than the thickness T2 of the first insulating layer 152 which is in contact with the insulating substrate 110. For example, the thickness T1 of the first insulating layer 152 which is in contact with the semiconductor chip 130 may be greater in the range of 1 to 50 μm, for example, 3 to 23 μm, than the thickness T2 of the first insulating layer 152 which is in contact with the insulating substrate 110.

Next, a first opening 151 exposing the through wiring 120 and a second opening 153 exposing the semiconductor chip pad 132 of the semiconductor chip 130 may be formed by removing a portion of the first insulating layer 152. A process of removing the first insulating layer 152 may be performed using an etching process or a laser ablation process. The first insulating layer 152 may include an insulating material, for example, an oxide, a nitride, or an EMC, etc.

Referring to FIG. 15, the re-wiring pattern 154 electrically connecting the through wiring 120 and the semiconductor chip pad 132 of the semiconductor chip 130 may be formed on the first insulating layer 152. The re-wiring pattern 154 may fill the first opening 151, and thus the re-wiring pattern 154 may be electrically and/or physically connected to the through wiring 120. Further, the re-wiring pattern 154 may fill the second opening 153, and thus the re-wiring pattern 154 may be electrically and/or physically connected to the semiconductor chip pad 132. The re-wiring pattern 154 may include a conductive material, for example, a metal such as copper, copper alloys, aluminum, or aluminum alloys. Further, the re-wiring pattern 154 may include carbon. The re-wiring pattern 154 may be formed using various methods including a deposition process, a plating process, a printing process, etc. Moreover, the re-wiring pattern 154 may be formed using the conductive paste used for forming the through wiring 120. The re-wiring pattern 154 may rewire the semiconductor chip 130. The re-wiring pattern 154 may be electrically and/or physically connected to the external connection member (see 160 of FIG. 18). Accordingly, the re-wiring pattern 154 may miniaturize the input and output terminals of the semiconductor chip 130, and also increase the number of the input and output terminals. Further, the semiconductor package 100 may have a fan-out structure by the re-wiring pattern 154.

Referring to FIG. 16, the second insulating layer 156 may be formed on the re-wiring pattern 154. The second insulating layer 156 may entirely cover the re-wiring pattern 154 and the first insulating layer 152. The second insulating layer 156 may include an insulating material, for example, an oxide, a nitride, or an EMC, etc. The first insulating layer 152 and the second insulating layer 156 may include the same material or different materials.

The first insulating layer 152, the re-wiring pattern 154, and the second insulating layer 156 may constitute the re-wiring pattern layer 150. The re-wiring pattern layer 150 may have a greater thickness at a lower side of the semiconductor chip 130 than a lower side of the insulating substrate 110.

Further, the re-wiring pattern layer 150 may have a previously manufactured structure, and an example in which the structure is bonded to the semiconductor chip 130 and the molding member 140 by a compressing process, a bonding process, a reflow process, etc. may be included in the spirit of the present invention.

Figure 17:
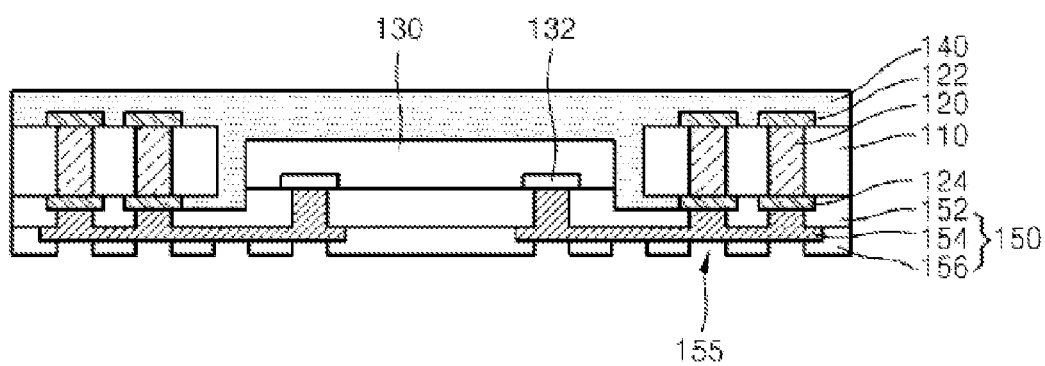

Referring to FIG. 17, a third opening 155 exposing a portion of the re-wiring pattern 154 may be formed by removing a portion of the second insulating layer 156. A process of removing the second insulating layer 156 may be performed using an etching process or a laser ablation process.

Figure 18:
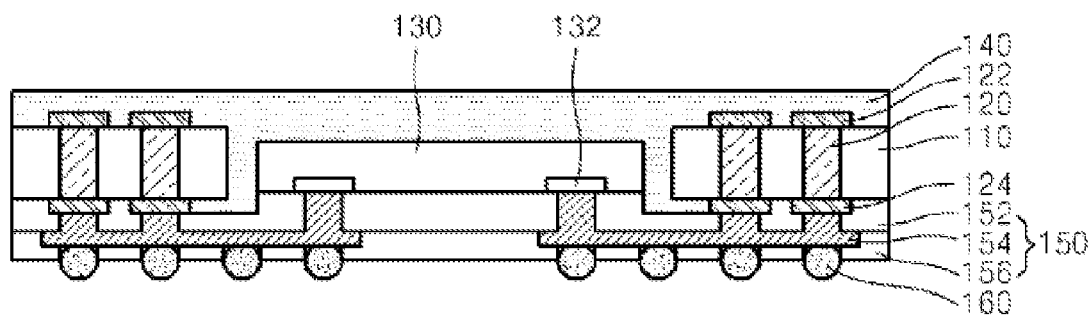

Referring to FIG. 18, the external connection member 160 electrically and/or physically connected to the re-wiring pattern 154 may be bonded. The external connection member 160 may be bonded to the exposed re-wiring pattern 154. The external connection member 160 may include a conductive material, for example, a metal. The external connection member 160 may be a solder ball.

Next, the semiconductor package 100 of FIG. 1 may be manufactured by removing a portion of the molding member 140 and exposing the upper pad 122. The exposed surface of the upper pad 122 and the re-wiring pattern layer 150 may be located to face each other on the both surfaces of the insulating substrate 110. A process of removing the molding member 140 may be performed using an etching process or a laser ablation process. Further, a process of forming the recess region 142 by removing a portion of the molding member 140 and exposing the upper pad 122 may be optionally performed, and in some cases, may be omitted.

Further, a process of cleansing the exposed upper pad 122 and a process of treating the surface may be further included. The process of treating the surface may be performed by Ni/Au electroless plating, Ni/Sn plating, or Sn plating.

Figure 19:
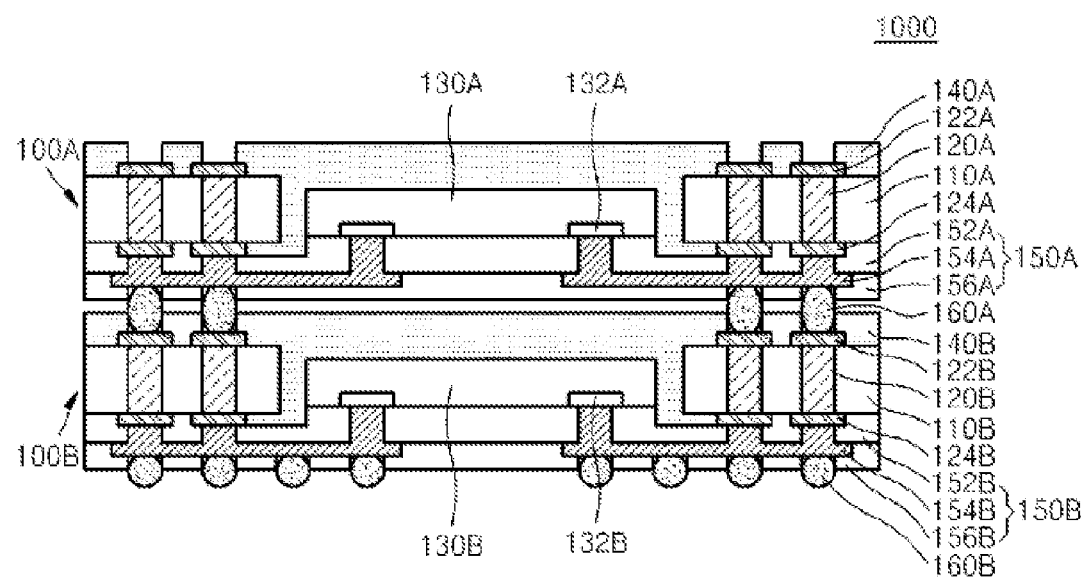
FIG. 19 is a cross-sectional view illustrating a package on package (PoP) in which a plurality of semiconductor packages shown in FIG. 1 are stacked.

FIG. 19 is a cross-sectional view illustrating a package on package (PoP) 1000 in which a plurality of semiconductor packages 100 shown in FIG. 1 are stacked. Duplicate descriptions between the PoP 1000 according to one embodiment of the present invention and the semiconductor package 100 described above will be omitted.

Referring to FIG. 19, the PoP 1000 may include semiconductor packages 100A and 100B which are vertically stacked. Specifically, an upper semiconductor package 100A may be located on a lower semiconductor package 100B. Further, PoPs in which two or more semiconductor packages are stacked may be included in the spirit of the present invention.

An external connection member 160A of the upper semiconductor package 100A may be electrically and/or physically connected to an upper pad 122B of the lower semiconductor package 100B. Accordingly, the external connection member 160A of the upper semiconductor package 100A may be electrically connected to a through wiring 120B of the lower semiconductor package 100B. Further, the external connection member 160A may be optionally aligned and/or fixed by a molding member 140B of the lower semiconductor package 100B.

An upper surface of an upper pad 122A of the upper semiconductor package 100A may be exposed upward, or be electrically connected to an external connection member of another semiconductor package (not shown).

An external connection member 160B of the lower semiconductor package 100B may be electrically connected to an external device such as an external substrate (not shown).

Hereinafter, an electrical connection relation between the semiconductor packages 100A and 100B will be described.

A semiconductor chip 130B of the lower semiconductor package 100B may be electrically connected to the external device (not shown) through a re-wiring pattern 154B and the external connection member 160B.

A semiconductor chip 130A of the upper semiconductor package 100A may be electrically connected to the external device (not shown) through a re-wiring pattern 154A, the external connection member 160A, the upper pad 122B, the through wiring 120B, a lower pad 124B, the re-wiring pattern 154B, and the external connection member 160B. Alternatively, the semiconductor chip 130A of the upper semiconductor package 100A may be electrically connected to the external device (not shown) through the re-wiring pattern 154A, a lower pad 124A, a through wiring 120A, and the upper pad 122A.

Further, the semiconductor chip 130A of the upper semiconductor package 100A may be electrically connected to the semiconductor chip 130B of the lower semiconductor package 100B through the re-wiring pattern 154A, the external connection member 160A, the upper pad 122B, the through wiring 120B, the lower pad 124B, and the re-wiring pattern 154B.

Figure 20:
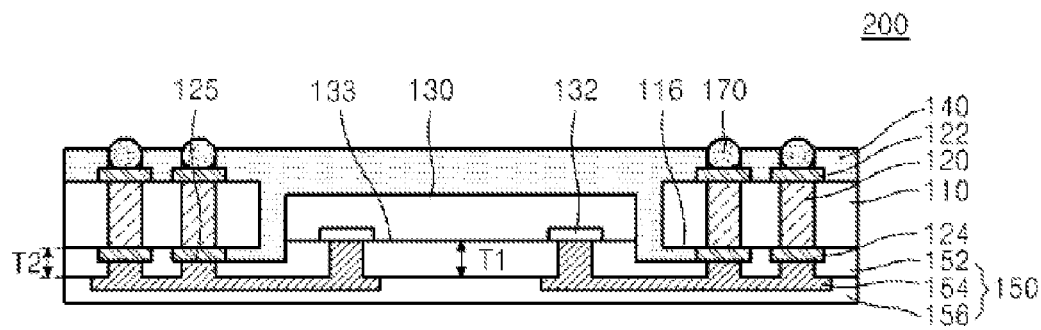
FIG. 20 is a cross-sectional view illustrating a semiconductor package according to another embodiment of the present invention.

FIG. 20 is a cross-sectional view illustrating a semiconductor package 200 according to another embodiment of the present invention. The semiconductor package 200 according to another embodiment of the present invention may be constituted by modifying some configuration of the semiconductor package described above, and thus duplicate descriptions will be omitted.

Referring to FIG. 20, the semiconductor package 200 may include an insulating substrate 110, a through wiring 120, an upper pad 122, a lower pad 124, a semiconductor chip 130, a molding member 140, a re-wiring pattern layer 150, and an external connection member 170. After performing the manufacturing processes shown in FIGS. 3 to 16, instead of a process of forming the external connection member 160, the external connection member 170 which is electrically and/or physically connected to the upper pad 122 may be bonded by removing a portion of the molding member 140 and exposing the upper pad 122. The external connection member 170 may include a conductive material, for example, a metal. The external connection member 170 may be a solder ball. The external connection member 170 and the external connection member 160 may include the same material or different materials.

A lower surface 133 of the semiconductor chip 130 may not be located in the same plane as a lower surface 125 of the lower pad 124 and/or a lower surface 116 of the insulating substrate 110. For example, the lower surface 133 of the semiconductor chip 130 may be recessed to have a step difference with respect to the lower surface 125 of the lower pad 124, or the lower surface 116 of the insulating substrate 110. Further, a thickness T1 of a first insulating layer 152 which is in contact with the semiconductor chip 130 may be greater than a thickness T2 of the first insulating layer 152 which is in contact with the insulating substrate 110.

Figure 21:
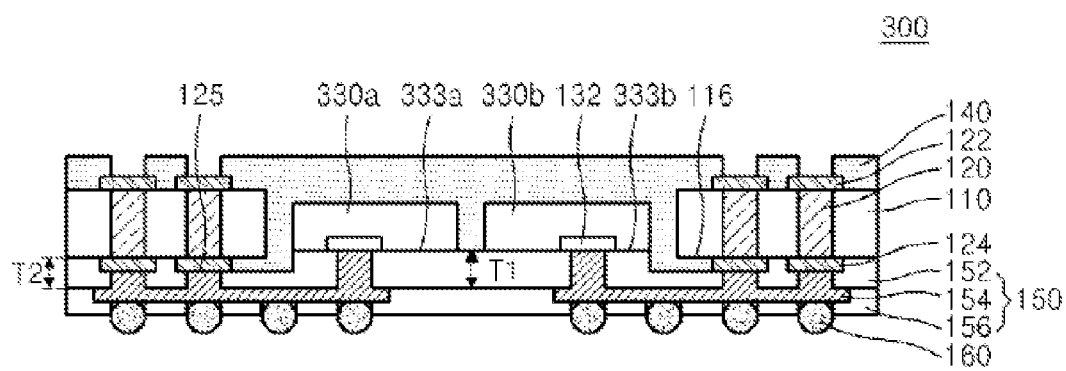
FIGS. 21 and 22 are cross-sectional views illustrating semiconductor packages according to another embodiment of the present invention.
Figure 22:
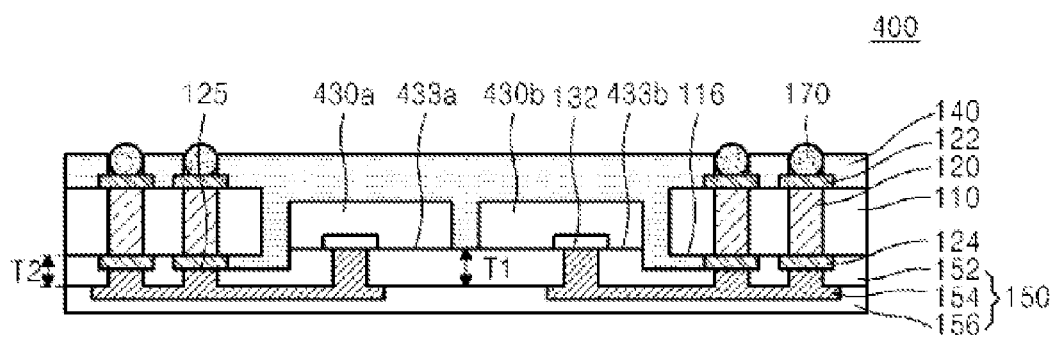

FIGS. 21 and 22 are cross-sectional views illustrating semiconductor packages 300 and 400 according to another embodiment of the present invention. The semiconductor packages 300 and 400 may be constituted by modifying the semiconductor package described above, and duplicate descriptions will be omitted.

Referring to FIG. 21, the semiconductor package 300 may include an insulating substrate 110, a through wiring 120, an upper pad 122, a lower pad 124, a first semiconductor chip 330a, a second semiconductor chip 330b, a molding member 140, a re-wiring pattern layer 150, and an external connection member 160. The first semiconductor chip 330a and the second semiconductor chip 330b may be electrically connected to the re-wiring pattern layer 150 like the semiconductor chip 130 of FIG. 1. The first semiconductor chip 330a and the second semiconductor chip 330b may have the same size or different sizes. The first semiconductor chip 330a and the second semiconductor chip 330b may be memory chips or logic chips. Further, the first semiconductor chip 330a may be the same kind of a product having the same function as or a different kind of a product having a different function from the second semiconductor chip 330b. For example, the first semiconductor chip 330a may be a logic chip, and the second semiconductor chip 330b may a memory chip, or vice versa. The semiconductor package 300 may constitute a system on chip (SOC) or a system in package (SIP).

A lower surface 333a of the first semiconductor chip 330a and/or a lower surface 333b of the second semiconductor chip 330b may not be located in the same plane as a lower surface 125 of the lower pad 124 and/or a lower surface 116 of the insulating substrate 110. For example, the lower surface 333a of the first semiconductor chip 330a and/or the lower surface 333b of the second semiconductor chip 330b may be recessed to have a step difference with respect to the lower surface 125 of the lower pad 124 or the lower surface 116 of the insulating substrate 110. Further, a thickness T1 of a first insulating layer 152 which is in contact with the first semiconductor chip 330a and the second semiconductor chip 330b may be greater than a thickness T2 of the first insulating layer 152 which is in contact with the insulating substrate 110.

An example in which the first semiconductor chip 330a and the second semiconductor chip 330b are arranged in a horizontal direction is illustrated in FIG. 21, but an example in which the first semiconductor chip 330a and the second semiconductor chip 330b are stacked in a vertical direction may be included in the spirit of the present invention.

Referring to FIG. 22, the semiconductor package 400 may include an insulating substrate 110, a through wiring 120, an upper pad 122, a lower pad 124, a third semiconductor chip 430a, a fourth semiconductor chip 430b, a molding member 140, a re-wiring pattern layer 150, and an external connection member 170. The third semiconductor chip 430a and the fourth semiconductor chip 430b may be electrically connected to the re-wiring pattern layer 150 like the semiconductor chip 130 of FIG. 20. The third semiconductor chip 430a and the fourth semiconductor chip 430b may have the same size or different sizes. The third semiconductor chip 430a and the fourth semiconductor chip 430b may be memory chips or logic chips. Further, the third semiconductor chip 430a may be the same kind of a product having the same function as or a different kind of a product having a different function from the fourth semiconductor chip 430b. For example, the third semiconductor chip 430a may be a logic chip, and the fourth semiconductor chip 430b may a memory chip, or vice versa. The semiconductor package 400 may constitute an SOC or an SIP.

A lower surface 433a of the third semiconductor chip 430a and/or a lower surface 433b of the fourth semiconductor chip 430b may not be located in the same plane as a lower surface 125 of the lower pad 124 and/or a lower surface 116 of the insulating substrate 110. For example, the lower surface 433a of the third semiconductor chip 430a and/or the lower surface 433b of the fourth semiconductor chip 430b may be recessed to have a step difference with respect to the lower surface 125 of the lower pad 124 or the lower surface 116 of the insulating substrate 110. Further, a thickness T1 of a first insulating layer 152 which is in contact with the third semiconductor chip 430a and the fourth semiconductor chip 430b may be greater than a thickness T2 of the first insulating layer 152 which is in contact with the insulating substrate 110.

An example in which the third semiconductor chip 430a and the fourth semiconductor chip 430b are arranged in a horizontal direction is illustrated in FIG. 22, but an example in which the third semiconductor chip 430a and the fourth semiconductor chip 430b are stacked in a vertical direction may be included in the spirit of the present invention.

Figure 23:
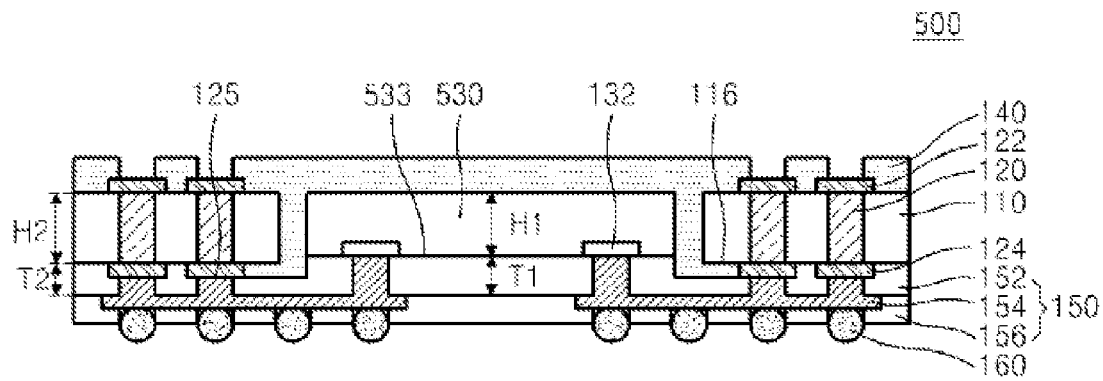
FIGS. 23 to 25 are cross-sectional views illustrating semiconductor packages according to still another embodiment of the present invention.
Figure 24:
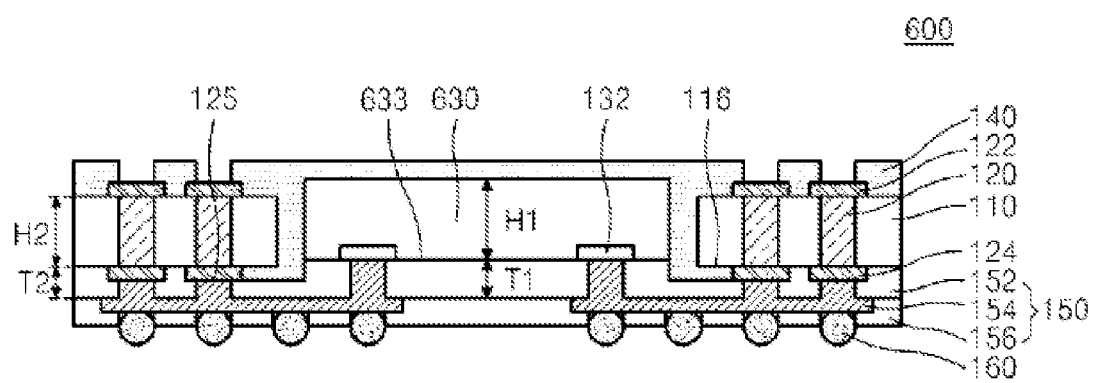
Figure 25:
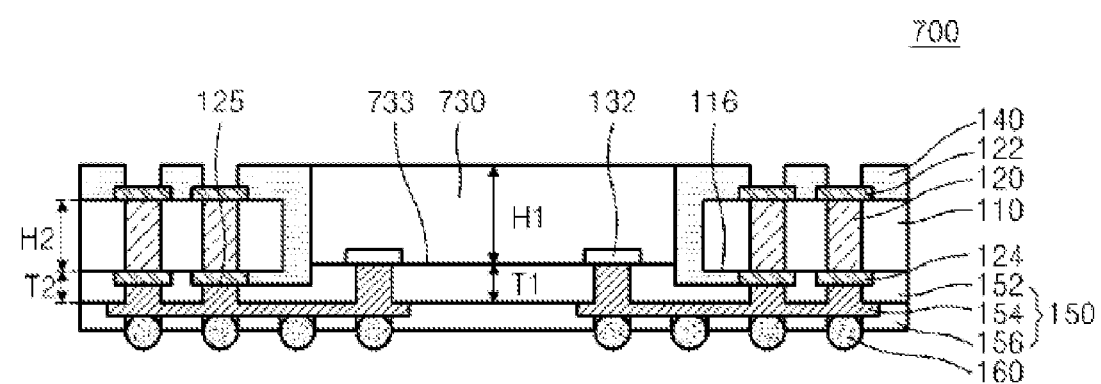

FIGS. 23 to 25 are cross-sectional views illustrating semiconductor packages 500, 600, and 700 according to still another embodiment of the present invention. The semiconductor packages 500, 600, and 700 according to still another embodiment of the present invention may be constituted by modifying some configuration of the semiconductor packages of the embodiments described above, and duplicate descriptions will be omitted.

Referring to FIG. 23, the semiconductor package 500 may include an insulating substrate 110, a through wiring 120, an upper pad 122, a lower pad 124, a semiconductor chip 530, a molding member 140, a re-wiring pattern layer 150, and an external connection member 160. In this embodiment, a height H1 of the semiconductor chip 530 may be equal to a height H2 of the insulating substrate 110. Accordingly, the height H1 of the semiconductor chip 530 may be equal to a height of the through wiring 120. Further, the top surface of the semiconductor chip 530 may be located in the same plane as the top surface of the insulating substrate 110.

A lower surface 533 of the semiconductor chip 530 may not be located in the same plane as a lower surface 125 of the lower pad 124 and/or a lower surface 116 of the insulating substrate 110. For example, the lower surface 533 of the semiconductor chip 530 may be recessed to have a step difference with respect to the lower surface 125 of the lower pad 124, or the lower surface 116 of the insulating substrate 110. Further, a thickness T1 of a first insulating layer 152 which is in contact with the semiconductor chip 530 may be greater than a thickness T2 of the first insulating layer 152 which is in contact with the insulating substrate 110.

Referring to FIG. 24, the semiconductor package 600 may include an insulating substrate 110, a through wiring 120, an upper pad 122, a lower pad 124, a semiconductor chip 630, a molding member 140, a re-wiring pattern layer 150, and an external connection member 160. In this embodiment, a height H1 of the semiconductor chip 630 may be greater than a height H2 of the insulating substrate 110. Accordingly, the height H1 of the semiconductor chip 630 may be greater than a height of the through wiring 120. Further, the top surface of the semiconductor chip 630 may be higher than the top surface of the insulating substrate 110. That is, the top surface of the semiconductor chip 630 may be located to be spaced apart from the re-wiring pattern layer 150 more than the top surface of the insulating substrate 110.

A lower surface 633 of the semiconductor chip 630 may not be located in the same plane as a lower surface 125 of the lower pad 124 and/or a lower surface 116 of the insulating substrate 110. For example, the lower surface 633 of the semiconductor chip 630 may be recessed to have a step difference with respect to the lower surface 125 of the lower pad 124, or the lower surface 116 of the insulating substrate 110. Further, a thickness T1 of a first insulating layer 152 which is in contact with the semiconductor chip 630 may be greater than a thickness T2 of the first insulating layer 152 which is in contact with the insulating substrate 110.

Referring to FIG. 25, the semiconductor package 700 may include an insulating substrate 110, a through wiring 120, an upper pad 122, a lower pad 124, a semiconductor chip 730, a molding member 140, a re-wiring pattern layer 150, and an external connection member 160. In this embodiment, a height H1 of the semiconductor chip 730 may be greater than a height H2 of the insulating substrate 110. Accordingly, the height H1 of the semiconductor chip 730 may be greater than a height of the through wiring 120. Further, the top surface of the semiconductor chip 730 may be higher than the top surface of the insulating substrate 110. That is, the top surface of the semiconductor chip 730 may be located to be spaced apart from the re-wiring pattern layer 150 more than the top surface of the insulating substrate 110. The top surface of the semiconductor chip 730 may be exposed from the molding member 140. The top surface of the semiconductor chip 730 may be located in the same plane as the top surface of the molding member 140.

A lower surface 733 of the semiconductor chip 730 may not be located in the same plane as a lower surface 125 of the lower pad 124 and/or a lower surface 116 of the insulating substrate 110. For example, the lower surface 733 of the semiconductor chip 730 may be recessed to have a step difference with respect to the lower surface 125 of the lower pad 124, or the lower surface 116 of the insulating substrate 110. Further, a thickness T1 of a first insulating layer 152 which is in contact with the semiconductor chip 730 may be greater than a thickness T2 of the first insulating layer 152 which is in contact with the insulating substrate 110.

Further, an example in which technical features of the semiconductor packages 200, 300, and 400 of FIGS. 20 to 22 are combined to the semiconductor packages 500, 600, and 700 of FIGS. 23 to 25 may be included in the spirit concept of the present invention.

Figure 26:
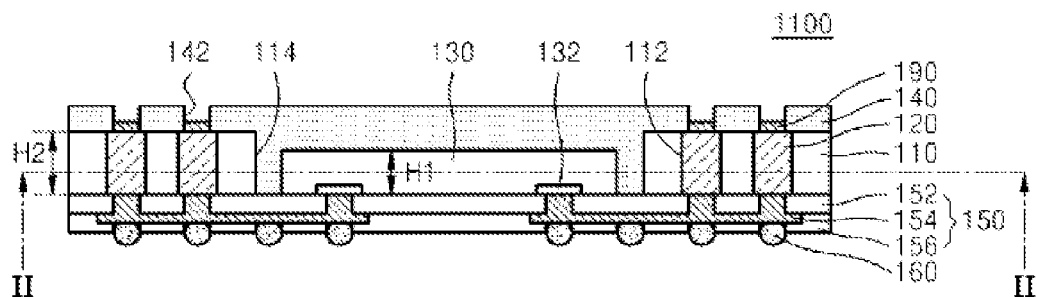
FIG. 26 is a cross-sectional view illustrating a semiconductor package according to yet another embodiment of the present invention.
Figure 27:
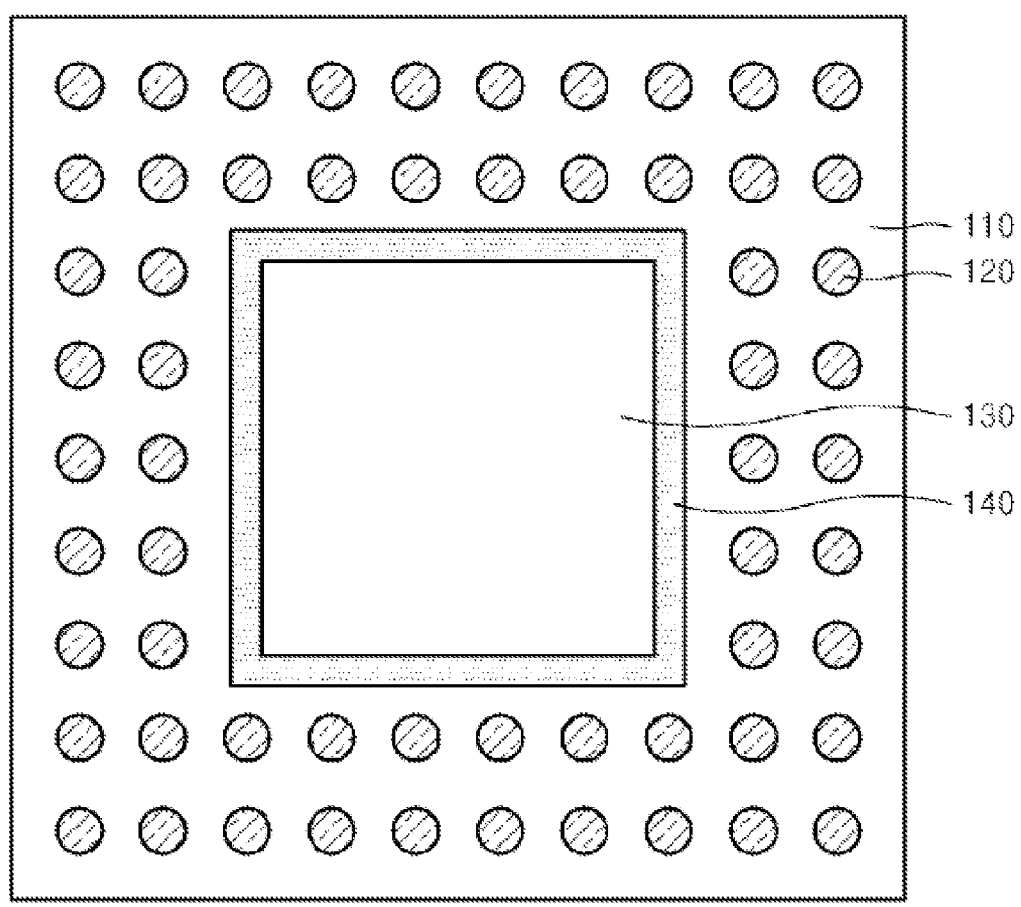
FIG. 27 is a plan view taken along line II-II' of the semiconductor package of FIG. 26 according to yet another embodiment of the present invention.

FIG. 26 is a cross-sectional view illustrating a semiconductor package 1100 according to yet another embodiment of the present invention. FIG. 27 is a cross-sectional view taken along line II-II' of the semiconductor package 1100 of FIG. 26 according to yet another embodiment of the present invention. The semiconductor package 1100 according to yet another embodiment of the present invention may be constituted by modifying some configuration of the semiconductor packages according to the embodiments described above, and duplicate descriptions will be omitted.

Referring to FIGS. 26 and 27, the semiconductor package 1100 may include an insulating substrate 110, a through wiring 120, a semiconductor chip 130, a molding member 140, a re-wiring pattern layer 150, and an external connection member 160. Further, the semiconductor package 1100 may further include a bonding layer 190.

The insulating substrate 110 may include a first through portion 112 and a second through portion 114. The through wiring 120 may be formed in the first through portion 112. The semiconductor chip 130 may be located in the second through portion 114.

The through wiring 120 may be located to penetrate the insulating substrate 110. The through wiring 120 may be electrically connected to the semiconductor chip 130 by the re-wiring pattern layer 150.

The semiconductor chip 130 may be located in the center of the insulating substrate 110, and the through wiring 120 may be located around the semiconductor chip 130. A height H1 of the semiconductor chip 130 may be smaller than a height H2 of the insulating substrate 110. Accordingly, the height H1 of the semiconductor chip 130 may be smaller than a height of the through wiring 120.

The molding member 140 may seal the semiconductor chip 130. The molding member 140 may have a recess region 142 exposing at least a portion of the top surface of the through wiring 120.

The re-wiring pattern layer 150 may be located at a lower side of the insulating substrate 110. A first insulating layer 152, a re-wiring pattern 154, and a second insulating layer 156 may constitute the re-wiring pattern layer 150.

The external connection member 160 may be electrically and/or physically connected to the re-wiring pattern 154, and thus be electrically connected to the semiconductor chip 130 and/or the through wiring 120. The external connection member 160 may electrically connect the semiconductor chip 130 and an external device.

Optionally, the bonding layer 190 may be located on the through wiring 120. The bonding layer 190 may be located in the recess region 142 of the molding member 140. The bonding layer 190 may include a conductive material, for example, a metal. The bonding layer 190 may fill a portion of the recess region 142, and thus the top surface of the bonding layer 190 may be recessed to have a step difference with respect to the top surface of the molding member 140.

Unlike the semiconductor package 100 shown in FIG. 1, the semiconductor package 1100 according to yet another embodiment of the present invention may not include an upper pad and a lower pad at an upper side and a lower side of the through wiring 120. Accordingly, the through wiring 120 may perform functions of the upper pad and lower pad. Further, optionally, the bonding layer 190 may perform the function of the upper pad.

FIGS. 28 to 40 are cross-sectional views for describing a method of manufacturing the semiconductor package 1100 of FIG. 26 according to yet another embodiment of the present invention.

Figure 28:
FIGS. 28 to 40 are cross-sectional views for describing a method of manufacturing the semiconductor package of FIG. 26 according to yet another embodiment of the present invention in process sequence.

Referring to FIG. 28, the insulating substrate 110 may be prepared.

Figure 29:
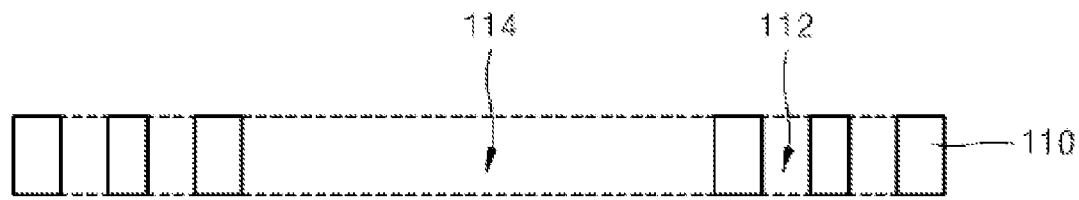

Referring to FIG. 29, the first through portion 112 and the second through portion 114 penetrating the insulating substrate 110 by removing a portion of the insulating substrate 110 may be simultaneously formed. The first through portion 112 and the second through portion 114 may be formed by performing the same process or different processes. A dotted line shown in FIG. 29 is only illustrated to clearly indicate the first through portion 112 and the second through portion 114, and does not mean that the insulating substrate 110 is divided into several parts.

Figure 30:
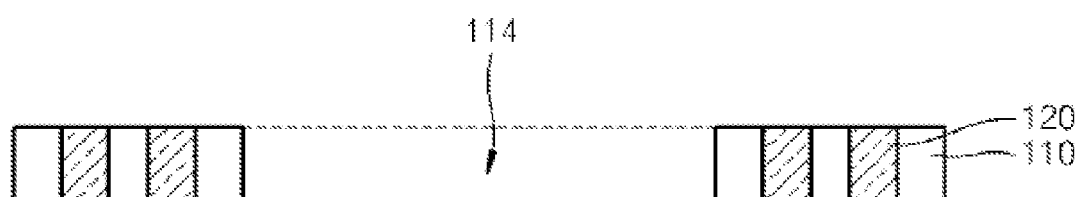

Referring to FIG. 30, the through wiring 120 may be formed in the insulating substrate 110. Specifically, the through wiring 120 may be formed by filling the first through portion 112 with a conductive material.

Figure 31:
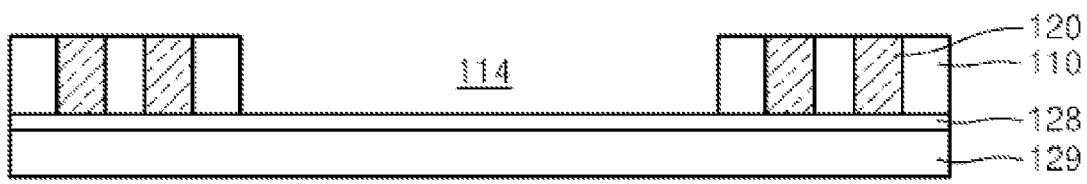

Referring to FIG. 31, the insulating substrate 110 may be bonded on a carrier substrate 129. For example, the insulating substrate 110 may be bonded on the carrier substrate 129 using an adhesive member 128.

Figure 32:
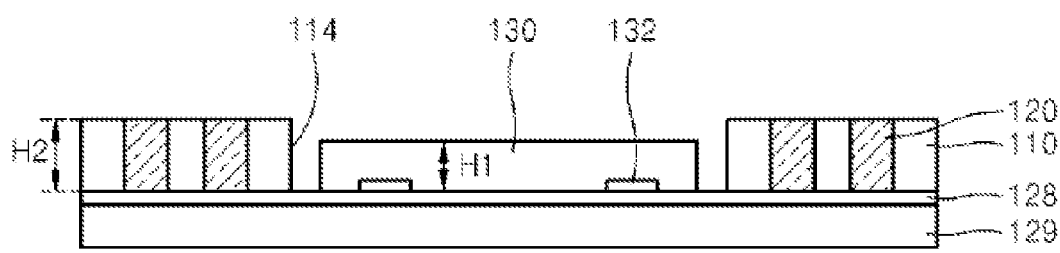

Referring to FIG. 32, the semiconductor chip 130 may be arranged in the insulating substrate 110. Specifically, the semiconductor chip 130 may be bonded to locate in the second through portion 114 of the insulating substrate 110 on the carrier substrate 129. The height H1 of the semiconductor chip 130 may be smaller than the height H2 of the insulating substrate 110. Accordingly, the top surface of the semiconductor chip 130 may have a step difference with respect to the top surface of the insulating substrate 110. However, this is only an example, and the spirit of the present invention is not limited thereto. For example, the height H1 of the semiconductor chip 130 may be equal to or greater than the height H2 of the insulating substrate 110. The through wiring 120 may be located to surround the semiconductor chip 130.

Figure 33:
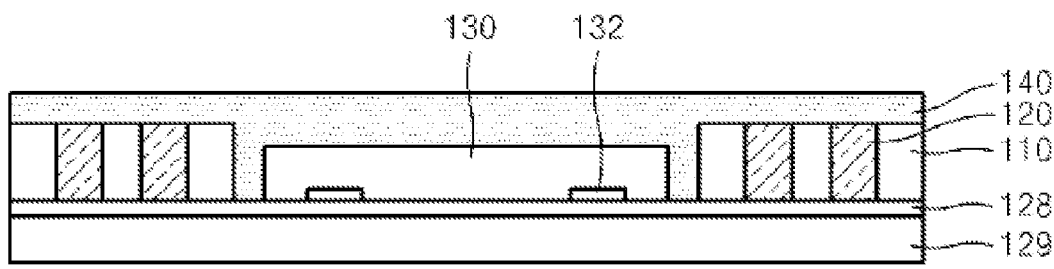

Referring to FIG. 33, the molding member 140 covering the insulating substrate 110 and the semiconductor chip 130 may be formed. The molding member 140 may seal the semiconductor chip 130.

Figure 34:
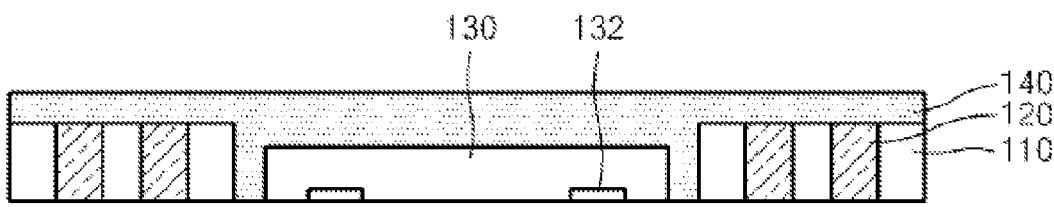

Referring to FIG. 34, the carrier substrate 129 and the adhesive member 128 may be removed. Accordingly, a semiconductor chip pad 132 of the semiconductor chip 130 and the through wiring 120 may be exposed from the molding member 140.

Figure 35:
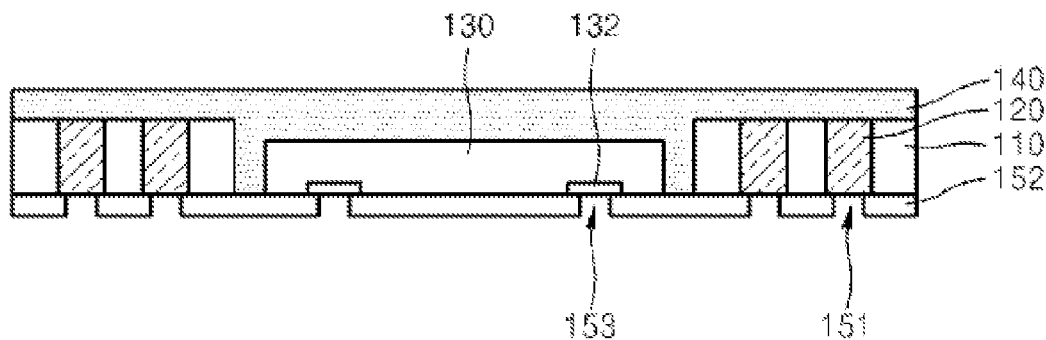
Figure 36:
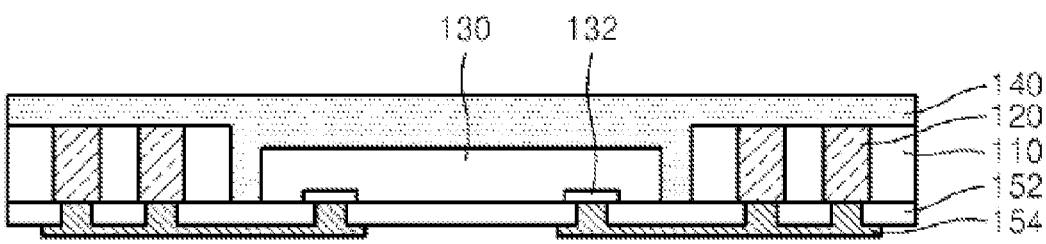
Figure 37:
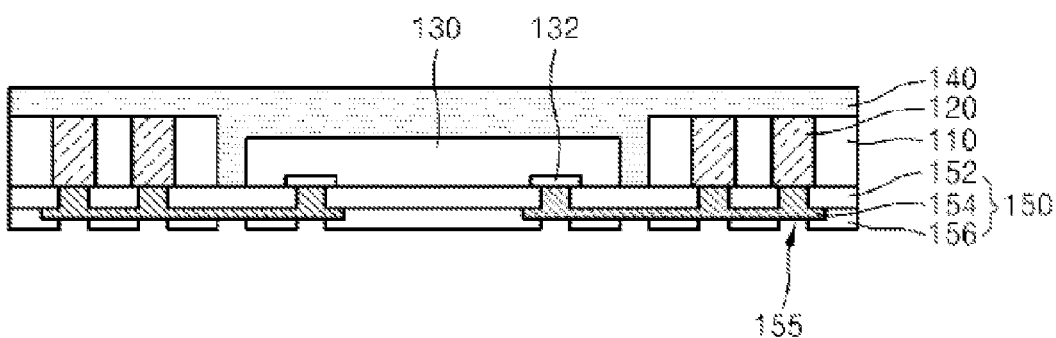

Referring to FIGS. 35 to 37, the re-wiring pattern layer 150 electrically connecting the through wiring 120 and the semiconductor chip 130 may be formed. The re-wiring pattern layer 150 may be formed by a method described with reference to FIGS. 14 to 16. The re-wiring pattern layer 150 may include the first insulating layer 152 formed on the insulating substrate 110 and the through wiring 120, the re-wiring pattern 154 which is located on the first insulating layer 152 and electrically connects the through wiring 120 and the semiconductor chip pad 132 of the semiconductor chip 130, and the second insulating layer 156 which is located on the re-wiring pattern 154 and has a third opening 155.

Figure 38:
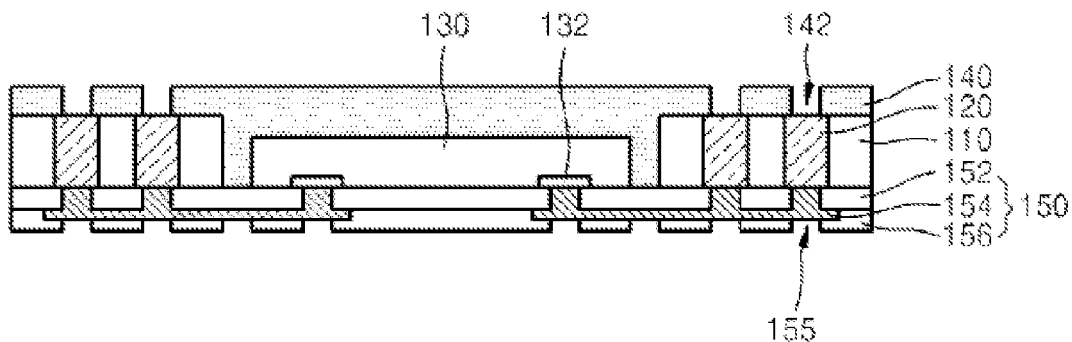

Referring to FIG. 38, the recess region 142 exposing the through wiring 120 by removing a portion of the molding member 140 may be formed. The exposed surface of the through wiring 120 and the re-wiring pattern layer 150 may be located to face each other on both surfaces of the insulating substrate 110. A process of removing the molding member 140 may be performed using an etching process or a laser ablation process.

Figure 39:
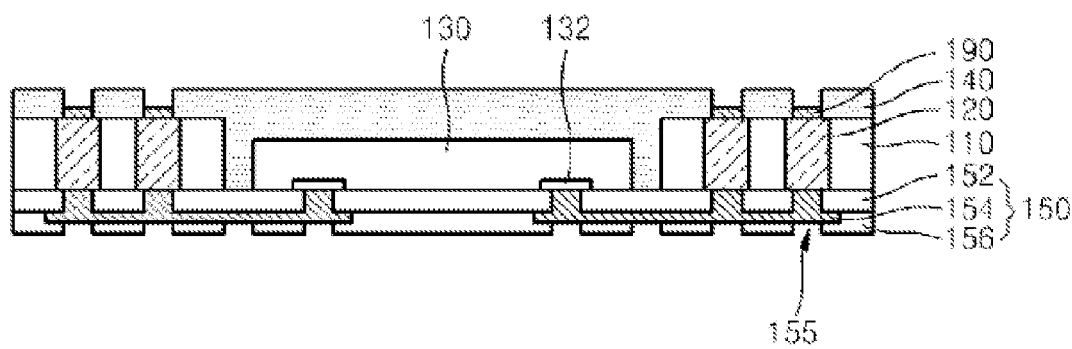

Referring to FIG. 39, the bonding layer 190 which is electrically and/or physically connected to the through wiring 120 may be formed in the recess region 142. The bonding layer 190 may partly or completely fill the recess region 142. The bonding layer 190 may include a conductive material, for example, a metal. The bonding layer 190 may be formed using various methods including a deposition process, a plating process, a printing process, etc. The bonding layer 190 may perform a function of improving an electrical contact with an external member of the through wiring 120, for example, a contact angle, or wettability. When a plurality of semiconductor packages 1100 are stacked, a function of improving the electrical contact with an external connection member of another semiconductor package may be performed. Further, when the external connection member of another semiconductor package fills the recess region 142 by a reflow process, the bonding layer 190 may perform a function of providing a conductive material so that a void is not formed in the recess region 142 and the recess region 142 is completely filled with the conductive material.

The bonding layer 190 may have a smaller planar dimension than the through wiring 120. However, this is an example, and the spirit of the present invention is not limited thereto. For example, an example in which the bonding layer 190 has the same planar dimension as or a greater planar dimension than the through wiring 120 may be included in the spirit of the present invention.

Further, a process of forming the bonding layer 190 may be optionally performed, and in some cases, may be omitted.

Figure 40:
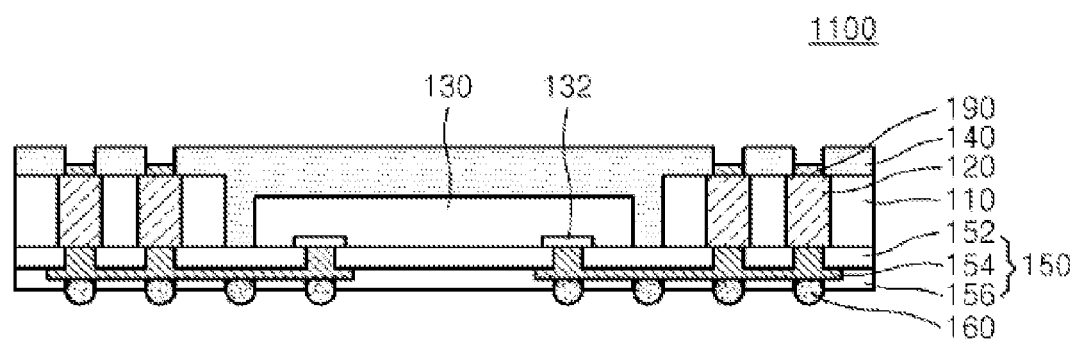

Referring to FIG. 40, the external connection member 160 which is electrically and/or physically connected to the re-wiring pattern 154 may be bonded. The external connection member 160 may be bonded on the exposed re-wiring pattern 154. Accordingly, the semiconductor package 1100 of FIG. 26 may be manufactured.

Figure 41:
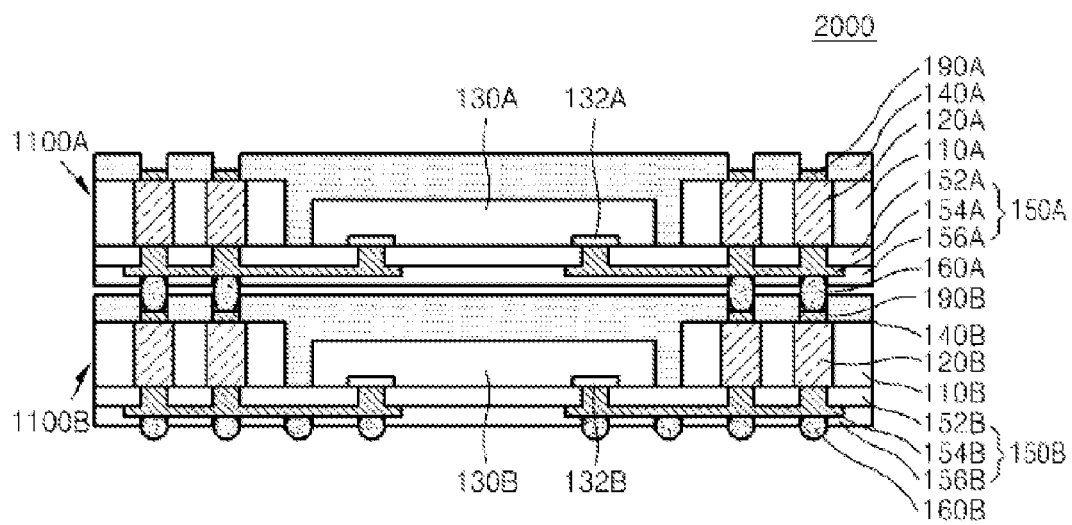
FIG. 41 is a cross-sectional view illustrating a package on package (PoP) in which a plurality of semiconductor packages shown in FIG. 26 are stacked.

FIG. 41 is a cross-sectional view illustrating a package on package (PoP) 2000 in which the plurality of semiconductor packages 1100 shown in FIG. 26 are stacked. Duplicate descriptions between the PoP 2000 according to this embodiment and the semiconductor package 1100 described above will be omitted.

Referring to FIG. 41, the PoP 2000 may include semiconductor packages 1100A and 1100B which are vertically stacked. Specifically, an upper semiconductor package 1100A may be located on a lower semiconductor package 1100B. Further, PoPs in which two or more semiconductor packages are stacked may be included in the spirit of the present invention.

An external connection member 160A of the upper semiconductor package 1100A may be electrically connected to a through wiring 120B of the lower semiconductor package 1100B. Further, optionally, the external connection member 160A may be electrically and/or physically connected to a bonding layer 190B located in a recess region 142B of the lower semiconductor package 1100B. The external connection member 160A may fill the recess region 142B of a molding member 140B of the lower semiconductor package 1100B, and thus the external connection member 160A may be aligned and/or fixed by the molding member 140B.

An upper surface of a bonding layer 190A of the upper semiconductor package 1100A may be exposed upward, or be electrically connected to an external connection member of another semiconductor package (not shown).

An external connection member 160B of the lower semiconductor package 1100B may be electrically connected to an external device such as an external substrate (not shown).

Hereinafter, an electrical connection relation between the semiconductor packages 1100A and 1100B will be described.

A semiconductor chip 130B of the lower semiconductor package 1100B may be electrically connected to the external device (not shown) through a re-wiring pattern 154B and the external connection member 160B.

A semiconductor chip 130A of the upper semiconductor package 1100A may be electrically connected to the external device (not shown) through a re-wiring pattern 154A, the external connection member 160A, the through wiring 120B, the re-wiring pattern 154B, and the external connection member 160B. Alternatively, the semiconductor chip 130A of the upper semiconductor package 1100A may be electrically connected to the external device (not shown) through the re-wiring pattern 154A and a through wiring 120A.

Further, the semiconductor chip 130A of the upper semiconductor package 1100A may be electrically connected to the semiconductor chip 130B of the lower semiconductor package 1100B through the re-wiring pattern 154A, the external connection member 160A, the through wiring 120B, and the re-wiring pattern 154B.

Figure 42:
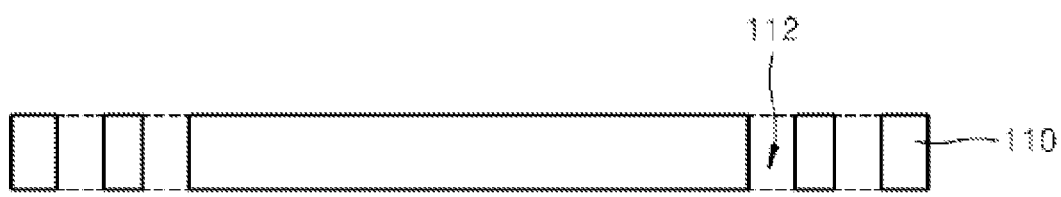
FIGS. 42 to 44 are cross-sectional views for describing a method of manufacturing the semiconductor package of FIG. 26 according to yet another embodiment of the present invention.
Figure 43:
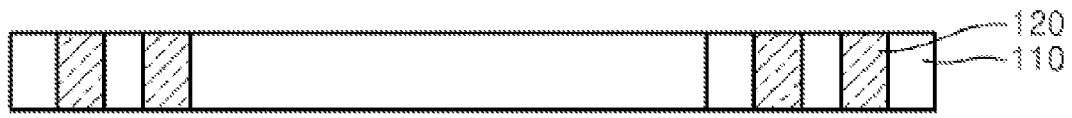
Figure 44:
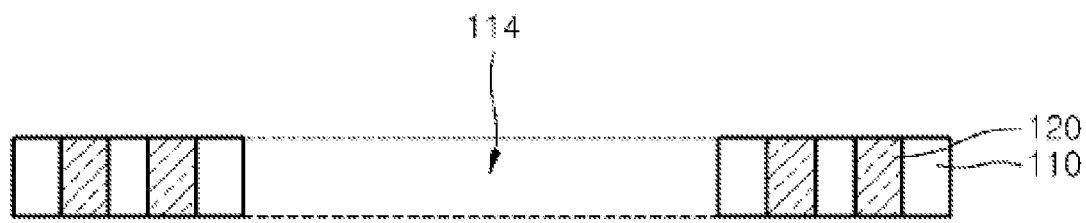

FIGS. 42 to 44 are cross-sectional views for describing a method of manufacturing the semiconductor package 1100 of FIG. 26 according to yet another embodiment of the present invention.

The process shown in FIG. 42 may be performed after the process of preparing the insulating substrate 110 described with reference to FIG. 28. Referring to FIG. 42, the first through portion 112 may be formed by removing a portion of the insulating substrate 110. Unlike the embodiment shown in FIG. 29, the second through portion 114 may not be formed.

Referring to FIG. 43, the through wiring 120 may be formed by filling the first through portion 112 with a conductive material.

Referring to FIG. 44, the second through portion 114 may be formed by removing a portion of the insulating substrate 110. Next, the semiconductor package 1100 of FIG. 26 may be manufactured by performing processes described above with reference to FIGS. 31 to 40.

The embodiment described with reference to FIGS. 42 to 44 can prevent that the conductive material is deposited in the second through portion 114 when forming the through wiring 120 by forming the first through portion 112 for the through wiring 120 and the second through portion 114 for insertion of the semiconductor chip 130 using different processes, and thus can reduce process costs and contamination, and increase process yield.

Figure 45:
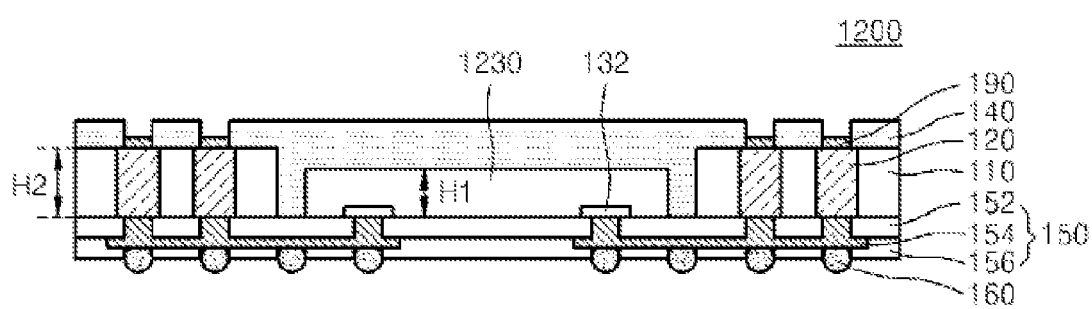
FIGS. 45 to 47 are cross-sectional views illustrating semiconductor packages according to yet another embodiment of the present invention.
Figure 46:
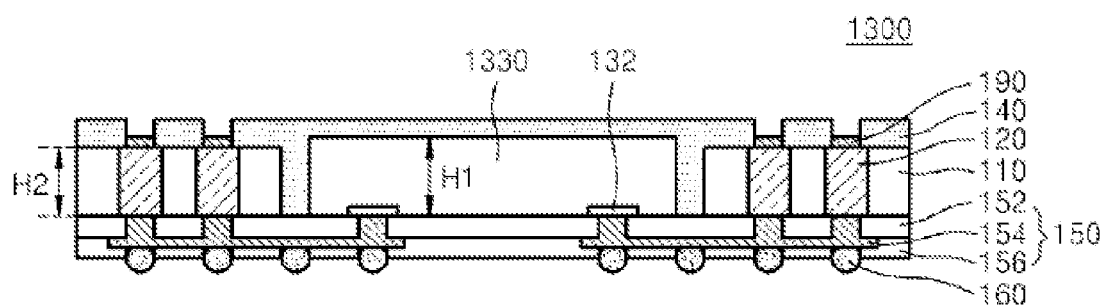
Figure 47:
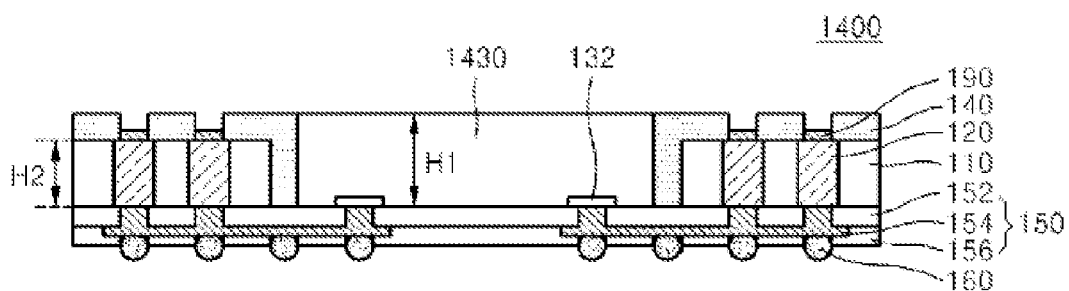

FIGS. 45 to 47 are cross-sectional views illustrating semiconductor packages 1200, 1300, and 1400 according to yet another embodiment of the present invention. The semiconductor packages 1200, 1300, and 1400 according to yet another embodiment of the present invention may be constituted by modifying some configuration of the semiconductor packages described above, and duplicate descriptions will be omitted.

Referring to FIG. 45, the semiconductor package 1200 may include a through wiring 120, a semiconductor chip 1230, a molding member 140, a re-wiring pattern layer 150, and an external connection member 160. Further, the semiconductor package 1200 may further include a bonding layer 190. In this embodiment, a height H1 of the semiconductor chip 1230 may be equal to a height H2 of an insulating substrate 110. Accordingly, the height H1 of the semiconductor chip 1230 may be equal to a height of the through wiring 120. Further, the top surface of the semiconductor chip 1230 may be located in the same plane as the top surface of the insulating substrate 110.

Referring to FIG. 46, the semiconductor package 1300 may include a through wiring 120, a semiconductor chip 1330, a molding member 140, a re-wiring pattern layer 150, and an external connection member 160. Further, the semiconductor package 1300 may further include a bonding layer 190. In this embodiment, a height H1 of the semiconductor chip 1330 may be greater than a height H2 of an insulating substrate 110. Accordingly, the height H1 of the semiconductor chip 1330 may be greater than a height of the through wiring 120. Further, the top surface of the semiconductor chip 1330 may be higher than the top surface of the insulating substrate 110. That is, the top surface of the semiconductor chip 1330 may be located to be spaced apart from the re-wiring pattern layer 150 more than the top surface of the insulating substrate 110.

Referring to FIG. 47, the semiconductor package 1400 may include a through wiring 120, a semiconductor chip 1430, a molding member 140, a re-wiring pattern layer 150, and an external connection member 160. Further, the semiconductor package 1300 may further include a bonding layer 190. In this embodiment, a height H1 of the semiconductor chip 1430 may be greater than a height H2 of an insulating substrate 110. Accordingly, the height H1 of the semiconductor chip 1430 may be greater than a height of the through wiring 120. Further, the top surface of the semiconductor chip 1430 may be higher than the top surface of the insulating substrate 110. That is, the top surface of the semiconductor chip 1430 may be located to be spaced apart from the re-wiring pattern layer 150 more than the top surface of the insulating substrate 110. Further, the top surface of the semiconductor chip 1430 may be exposed from the molding member 140. Moreover, the top surface of the semiconductor chip 1430 may be located in the same plane as the top surface of the molding member 140.

Figure 48:
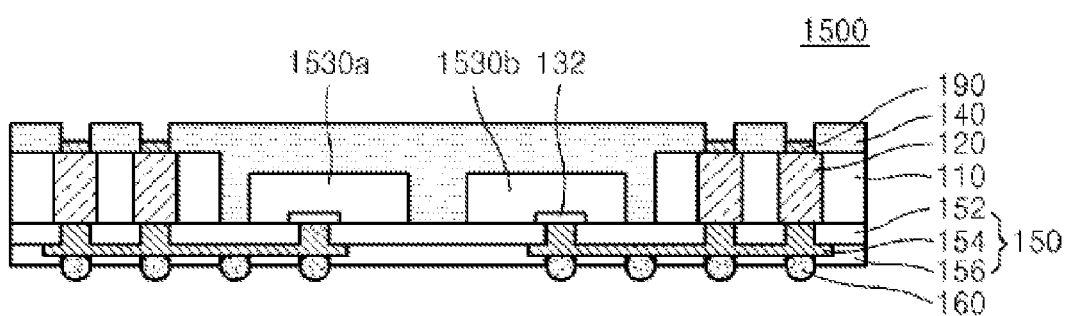
FIG. 48 is a cross-sectional view illustrating a semiconductor package according to yet another embodiment of the present invention.

FIG. 48 is a cross-sectional view illustrating a semiconductor package 1500 according to yet another embodiment of the present invention. The semiconductor package 1500 according to yet another embodiment of the present invention may be constituted by modifying some configuration of the semiconductor package described above, and duplicate descriptions will be omitted.

Referring to FIG. 48, the semiconductor package 1500 may include a through wiring 120, a first semiconductor chip 1530a, a second semiconductor chip 1530b, a molding member 140, a re-wiring pattern layer 150, and an external connection member 160. The first semiconductor chip 1530a and the second semiconductor chip 1530b may be electrically connected to the re-wiring pattern layer 150 like the semiconductor chip 130 of FIG. 1 or 26. The first semiconductor chip 1530a and the second semiconductor chip 1530b may have the same size or different sizes. The first semiconductor chip 1530a and the second semiconductor chip 1530b may be memory chips or logic chips. Further, the first semiconductor chip 1530a may be the same kind of a product having the same function as or a different kind of a product having a different function from the second semiconductor chip 1530b. For example, the first semiconductor chip 1530a may be a logic chip and the second semiconductor chip 1530b may be a memory chip, or vice versa. The semiconductor package 1500 may constitute an SOC or an SIP.

An example in which the first semiconductor chip 1530a and the second semiconductor chip 1530b are arranged in a horizontal direction is illustrated, but an example in which the first semiconductor chip 1530a and the second semiconductor chip 1530b are arranged in a vertical direction may be included in the spirit of the present invention. Further, an example in which technical features of the semiconductor packages 1200, 1300, and 1400 of FIGS. 45 to 47 are combined to the semiconductor package 1500 of FIG. 48 may be included in the spirit concept of the present invention.

Unlike a conventional art installing a semiconductor chip, forming a through hole, filling the through hole, and forming a through wiring, since the semiconductor package according to the spirit of the present invention previously forms the through hole in an insulating substrate, forms the through wiring by filling the through hole, and installs the semiconductor chip, the through wiring capable of reducing damage with respect to the semiconductor chip during a manufacturing process and having precision and a low process defect can be provided.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:
1. A semiconductor package, comprising:
an insulating substrate including a first through portion and a second through portion;
a through wiring which fills the first through portion, and is located to penetrate the insulating substrate;
a semiconductor chip which is located in the second through portion, and is electrically connected to the through wiring;

a molding member covering the semiconductor chip and the insulating substrate, filling a space between the semiconductor chip and the insulating substrate, and having an epoxy mold compound;

an upper pad located on the through wiring and electrically connected to the through wiring;

a lower pad located under the through wiring and electrically connected to the through wiring; and a re-wiring pattern layer which is located at a lower side of the insulating substrate, and electrically connects the through wiring and a semiconductor chip pad, wherein the molding member above the upper pad is removed to expose the upper pad so that the molding member has a recess region above the upper pad, wherein the semiconductor chip and the insulating substrate have different thicknesses, and wherein the molding member fills a space between the insulating substrate and the re-wiring pattern layer.

2. The semiconductor package according to claim 1, wherein a top surface of the upper pad has a step difference with respect to a top surface of the molding member above the semiconductor chip.

3. The semiconductor package according to claim 2, wherein a lower surface of the semiconductor chip is recessed to have a step difference with respect to a lower surface of the lower pad.

4. The semiconductor package according to claim 2, wherein the re-wiring pattern layer comprises:
a first insulating layer formed on the insulating substrate and the semiconductor chip such that the lower pad and a semiconductor chip pad of the semiconductor chip are exposed;
a re-wiring pattern which is located on the first insulating layer, and electrically connects the through wiring and the semiconductor chip pad; and
a second insulating layer which is located on the re-wiring pattern, and exposes a portion of the re-wiring pattern,
wherein a thickness of the first insulating layer which is in contact with the semiconductor chip is greater than a thickness of the first insulating layer which is in contact with the insulating substrate.

5. The semiconductor package according to claim 2, further comprising:
an external connection member which is located at a lower side of the re-wiring pattern layer, and is electrically connected to the re-wiring pattern layer.

6. The semiconductor package according to claim 2, further comprising:
an external connection member which is located at the top surface of the upper pad, and is electrically connected to the upper pad.

7. The semiconductor package according to claim 6, wherein a portion of the external connection member is positioned at the recess region and is buried by the molding member.

8. The semiconductor package according to claim 2, wherein the upper pad, the lower pad, or both thereof has a greater width than the through wiring.

9. A semiconductor package comprising:
an insulating substrate including a first through portion and a second through portion;
a through wiring which fills the first through portion, and is located to penetrate the insulating substrate;
a semiconductor chip which is located in the second through portion, and is electrically connected to the through wiring;

a molding member covering the semiconductor chip and the insulating substrate, filling a space between the semiconductor chip and the insulating substrate, and having an epoxy mold compound;

a bonding layer located on the though wiring and electrically connected to the through wiring; and a re-wiring pattern layer which is located at a lower side of the insulating substrate, and electrically connects the though wiring and the semiconductor chip, wherein the molding member has a recess region above the bonding layer, and the recess region is defined by a top surface of the bonding layer and sidewall of the molding member, wherein the semiconductor chip and the insulating substrate have different thicknesses, and wherein the top surface of the bonding layer has step difference with respect to a top surface of the molding member above the semiconductor chip.

10. The semiconductor package according to claim 9, wherein the bonding layer has a smaller planar dimension than the through wiring.

11. The semiconductor package according to claim 9, wherein the re-wiring pattern layer comprises:
a first insulating layer formed on the insulating substrate and the semiconductor chip such that bottom surface of the through wiring and a semiconductor chip pad of the semiconductor chip are exposed;
a re-wiring pattern which is located on the first insulating layer, and electrically connects the through wiring and the semiconductor chip pad; and
a second insulating layer which is located on the re-wiring pattern, and exposed a portion of the re-wiring pattern.

12. The semiconductor package according to claim 9, further comprising:
an external connection member which is located at a lower side of the re-wiring pattern layer, and is electrically connected to the re-wiring pattern layer.

13. The semiconductor package according to claim 9, further comprising:
an external connection member located at the top surface of the bonding layer, and is electrically connected to the bonding layer.

14. The semiconductor package according to claim 13, wherein a portion of the external connection member is positioned at the recess region and is buried by the molding member.

15. A method of manufacturing a semiconductor package, comprising:
preparing an insulating substrate having a first through portion in which a through wiring is filled, and a second through portion located in a center of the insulating substrate; and on which an upper pad and a lower pad are placed face to face in the center of the through wiring;
bonding the insulating substrate on a carrier substrate;
arranging a semiconductor chip in the second through portion of the insulating substrate on the carrier substrate, in which a semiconductor chip pad of the semiconductor chip is arranged to face the carrier substrate;
forming a molding member having an epoxy mold compound to cover the insulating substrate and the semiconductor chip, to fill a space between the semiconductor chip and the insulating substrate, and to fill a space between the semiconductor chip and the insulating substrate;

removing the carrier substrate such that the lower pad connected to the through wiring is exposed from the molding member;

forming a re-wiring pattern on the exposed lower pad and on a lower side of the semiconductor chip, by which the through wiring and the semiconductor chip pad of the semiconductor are electrically connected; and removing a portion of the molding member on opposite side of the re-wiring pattern to expose the upper pad formed on the through wiring and to form a recess region defined by a top surface of the upper pad and a sidewall of the molding member.

16. The method of manufacturing the semiconductor package according to claim 15,
wherein the top surface of the upper pad has a step difference with respect to a top surface of the molding member above the semiconductor chip.

17. The method of manufacturing the semiconductor package according to claim 15, after removing the portion of the molding member on the through wiring, further comprising:
connecting an external connection member to the upper pad so that a portion of the external connection member is buried in the recess region.

18. A method of manufacturing the semiconductor package comprising:
preparing an insulating substrate having a first through portion in which a through wiring is filled, and a second through portion located in a center of the insulating substrate;
bonding the insulating substrate on a carrier substrate;
arranging a semiconductor chip in the second through portion of the insulating substrate on the carrier substrate, in which a semiconductor chip pad of the semiconductor chip is arranged to face the carrier substrate;
forming a molding member having an epoxy mold compound to cover the insulating substrate and the semiconductor chip, to fill a space between the semiconductor chip and the insulating substrate, and to fill a space between the semiconductor chip and the insulating substrate;
removing the carrier substrate such that the through wiring and a semiconductor chip pad of the semiconductor chip are exposed from the molding member;
forming a re-wiring pattern on the exposed through wiring and the semiconductor chip pad, by which the through wiring and the semiconductor chip pad are electrically connected;
removing a portion of the molding member on opposite side of the re-wiring pattern to expose the through wiring; and
forming a bonding layer on the exposed through wiring to form a recess region defined by a top surface of the bonding layer and a sidewall of the molding member.

19. The method of manufacturing the semiconductor package according to claim 18, after forming the bonding layer on the exposed through wiring, further comprising:
connecting an external connection member to the bonding layer so that a portion of the external connection member is buried in the recess region.

20. A package on package, comprising:
a lower semiconductor package, comprising;
a lower insulating substrate including a first through portion and a second through portion,
a lower through wiring filling the first through portion,
a first pad located on an upper surface of the lower insulating substrate, and electrically connected to the lower through wiring,
a second pad located on an lower surface of the lower insulating substrate, and electrically connected to the lower through wiring,
a lower semiconductor chip located in the second through portion,
a lower molding member molding the lower semiconductor chip and the lower insulating substrate, filling a space between the lower semiconductor chip and the lower insulating substrate, having an epoxy mold compound, and having a recess region exposing the first pad, and
a lower re-wiring pattern layer located at a lower side of the lower insulating substrate, and electrically connecting the lower through wiring and a semiconductor chip pad of the lower semiconductor chip,
an upper semiconductor package, comprising;
an upper insulating substrate including a third through portion and a fourth through portion,
an upper semiconductor chip located in the fourth through portion, and electrically connected to the upper through wiring,
an upper molding member molding the upper semiconductor chip and the upper insulating substrate, filling a space between the upper semiconductor chip and the upper insulating substrate, and having epoxy mold compound, and
an upper re-wiring pattern layer located at a lower side of the upper insulating substrate, and electrically connecting the upper through wiring and a semiconductor chip pad of the upper semiconductor chip,
wherein the upper semiconductor package is located at an upper side of the lower semiconductor package via an external connection member, which is partially buried in the recess region of the lower semiconductor package in which the recess region is formed by removing a portion of the lower molding member and is electrically connected to the lower through wiring of the lower semiconductor package.

21. A package on package, comprising;
a lower semiconductor package, comprising;
a lower insulating substrate including a first through portion and a second through portion,
a lower through wiring filling the first through portion,
a lower semiconductor chip located in the second through portion, and electrically connected to the lower through wiring,
a lower molding member filling a space between the lower semiconductor chip and the lower insulating substrate, having an epoxy mold compound, and including a lower recess region exposing the top side of the lower through wiring, and
a lower re-wiring pattern layer which is located at a lower side of the lower insulating substrate, and electrically connects the lower through wiring and a semiconductor chip pad of the lower semiconductor chip,
an upper semiconductor package, comprising;
an upper insulating substrate including a third through portion and a fourth through portion,
an upper through wiring filling the third through portion, an upper semiconductor chip which is located in the fourth through portion, and is electrically connected to the upper through wiring, an upper molding member filling a space between the upper semiconductor chip and the upper insulating substrate, an upper re-wiring pattern layer which is located at a lower side of the upper insulating substrate, and electrically connects the upper through wiring and the upper semiconductor chip, and an upper external connection member which is electrically connected to the upper re-wiring pattern layer, wherein the upper semiconductor package is located at an upper side of the lower semiconductor package, and the upper external connection member of the upper semiconductor package is electrically connected to the lower through wiring of the lower semiconductor package and is partially buried in the recess region defined by sidewall of the lower molding member of the lower semiconductor package.

* * * * *